United States Patent
Wu et al.

(10) Patent No.: US 10,628,060 B2
(45) Date of Patent: Apr. 21, 2020

(54) SMART STORAGE MANAGEMENT BASED ON DYNAMIC LOGIC CAPACITY FOR THE STORAGE

(71) Applicant: HUAWEI TECHNOLOGIES CO., LTD., Bantian, Longgang District (CN)

(72) Inventors: Liming Wu, Shenzhen (CN); Jianye Yao, Chengdu (CN); Bin Huang, Chengdu (CN); Hongqiang Cao, Chengdu (CN); Chao Xu, Chengdu (CN); Yibin Li, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/959,276

(22) Filed: Apr. 22, 2018

(65) Prior Publication Data
US 2018/0246664 A1 Aug. 30, 2018

Related U.S. Application Data

(63) Continuation of application No. PCT/CN2016/087096, filed on Jun. 24, 2016.

(51) Int. Cl.
*G06F 12/00* (2006.01)
*G06F 3/06* (2006.01)
(Continued)

(52) U.S. Cl.
CPC .......... *G06F 3/0631* (2013.01); *G06F 3/0604* (2013.01); *G06F 3/0608* (2013.01);
(Continued)

(58) Field of Classification Search
CPC .... G06F 3/0631; G06F 3/0604; G06F 3/0608; G06F 3/0626; G06F 3/0658; G06F 3/0679; G06F 12/0246; G06F 12/023; G06F 2212/401; G11C 16/06; G11C 7/1006; G11C 16/10
See application file for complete search history.

(56) References Cited

U.S. PATENT DOCUMENTS 5,960,465 A * 9/1999 Adams ................ G06F 12/0292
710/68
7,188,227 B2 3/2007 Luick
(Continued)

FOREIGN PATENT DOCUMENTS

CN 102934093 A 2/2013
CN 103620690 A 3/2014
(Continued)

OTHER PUBLICATIONS

Intel Corporation et al: "Solid-State Drive DC S3700 Series", Jan. 15, 2015, XP055469389, 34 pages.
(Continued)

*Primary Examiner* — Mark A Giardino, Jr.
(74) *Attorney, Agent, or Firm* — Kilpatrick Townsend & Stockton LLP

(57) ABSTRACT

Providing a data processing manner, wherein: a SSD compresses a data; the SSD storing the compressed data; the SSD sends a feedback information to a controller, wherein the feedback information indicates a remaining capacity of the SSD after the compressed data is stored.

6 Claims, 15 Drawing Sheets

(51) Int. Cl.
  *G11C 16/06* (2006.01)
  *G11C 7/10* (2006.01)
  *G11C 16/10* (2006.01)
  *G06F 12/02* (2006.01)
  *G06F 13/00* (2006.01)
  *G06F 13/28* (2006.01)

(52) U.S. Cl.
  CPC .......... *G06F 3/0626* (2013.01); *G06F 3/0658* (2013.01); *G06F 3/0679* (2013.01); *G06F 12/023* (2013.01); *G06F 12/0246* (2013.01); *G11C 7/1006* (2013.01); *G11C 16/06* (2013.01); *G11C 16/10* (2013.01); *G06F 2212/401* (2013.01); *G06F 2212/7204* (2013.01)

(56) References Cited

U.S. PATENT DOCUMENTS

| | | | | |
|---|---|---|---|---|
| 7,631,121 | B2* | 12/2009 | Poo | G06F 3/0607 710/52 |
| 9,317,362 | B2 | 4/2016 | Khan | |
| 2002/0116569 | A1* | 8/2002 | Kim | G06F 12/0246 711/103 |
| 2004/0128414 | A1* | 7/2004 | Rudelic | G06F 12/0638 710/52 |
| 2005/0276191 | A1* | 12/2005 | Kashihara | G11B 7/00736 369/53.2 |
| 2010/0125705 | A1* | 5/2010 | Mehra | G06F 3/0608 711/114 |
| 2011/0125955 | A1* | 5/2011 | Chen | G06F 12/0246 711/103 |
| 2012/0079174 | A1 | 3/2012 | Nellans et al. | |
| 2012/0260025 | A1 | 10/2012 | Hida et al. | |
| 2014/0040639 | A1 | 2/2014 | Raam | |
| 2014/0059278 | A1 | 2/2014 | Schuh et al. | |
| 2014/0181369 | A1 | 6/2014 | Horn | |
| 2014/0337689 | A1* | 11/2014 | Khan | G06F 3/0608 714/773 |
| 2014/0379974 | A1 | 12/2014 | Yamamoto et al. | |
| 2015/0100556 | A1 | 4/2015 | Sekiguchi et al. | |
| 2015/0293858 | A1 | 10/2015 | Raam et al. | |
| 2016/0011786 | A1 | 1/2016 | Ninose et al. | |
| 2016/0321015 | A1 | 11/2016 | Fukutomi et al. | |
| 2018/0060235 | A1* | 3/2018 | Yap | G06F 12/04 |
| 2018/0060367 | A1* | 3/2018 | Ioannou | G06F 16/2272 |

FOREIGN PATENT DOCUMENTS

| | | |
|---|---|---|
| CN | 104380267 A | 2/2015 |
| JP | 2012221251 A | 11/2012 |
| JP | 2013161447 A | 8/2013 |
| JP | 2014506688 A | 3/2014 |
| JP | 2016507816 A | 3/2016 |
| WO | 2015015611 A1 | 2/2015 |

OTHER PUBLICATIONS

Micron:"Technical Note Client SATA SSD SMART Attribute Reference Introduction", Jan. 1, 2013, XP055470118, 30 pages.

* cited by examiner (0.5, 3.5)　　(1.5, 2.5)　　(0.5, 1.5, 2)　　(0.5, 1, 0.5, 2)

4KB physical page
Compressed blocks are aligned to boundaries
and written into the physical page

SMART STORAGE MANAGEMENT BASED ON DYNAMIC LOGIC CAPACITY FOR THE STORAGE

CROSS-REFERENCE TO RELATED APPLICATION

This application is a continuation of International Application No. PCT/CN2016/087096, filed on Jun. 24, 2016, the disclosure of which is hereby incorporated by reference in its entirety.

TECHNICAL FIELD

The present invention relates to the storage system field, and in particular, to a data processing method, a storage apparatus, a solid state disk, and a storage system.

BACKGROUND

A storage system generally includes a host, a controller (or referred to as a storage controller, or a storage array controller), and a disk array. The controller is a bridge between the host and the disk array, and is configured to control communication and data exchange between the host and a disk.

Currently, all mainstream storage systems support data compression and decompression functions. For example, before data is written into a disk, the storage system generally compresses the data. For another example, after data is read from a disk, the storage system first decompresses the data, and then returns decompressed data to the host. Data compression and decompression can save disk space.

In the prior art, the data compression and decompression functions of the storage system are mainly implemented by the controller, and specifically, may be implemented by a processor in the controller. For example, for a write request (or referred to as write input/output (IO)), the controller first compresses the data, and then writes compressed data into a disk. For a read request (or referred to as a read TO), the controller first reads compressed data from a disk, then decompresses the read data, and returns decompressed data to the host. It can be learned from the foregoing process that, the controller needs to participate in an entire process of compression and decompression. However, data compression and decompression need to consume a large quantity of computing resources, causing more computational pressure to the controller.

SUMMARY

This application provides a data processing method, a storage apparatus, a solid state disk, and a storage system, so as to reduce computational pressure of a controller.

According to a first aspect, a data processing method is provided, where the method is applied to a solid state disk (Solid State Disk, SSD). Specifically, the method may be executed by the SSD, for example, may be executed by a processor in the SSD. The method includes: receiving, by the SSD, a write request from a controller, where the write request carries to-be-written data; and compressing, by the SSD, the to-be-written data to obtain compressed data. It should be understood that, the SSD may compress the to-be-written data according to a logical block, that is, a quantity of compressed blocks obtained by means of compression depends on a quantity of logical block addresses (Logical Block Address, LBA) allocated to the to-be-written data. In addition, the SSD may use fixed-length compression or variable-length compression. The method further includes: storing, by the SSD, the compressed data; and sending, by the SSD, first feedback information to the controller, where the first feedback information indicates a remaining capacity of the SSD after the compressed data is stored. It should be understood that, the first feedback information may indicate the remaining capacity in a plurality of manners, for example, in a direct indication manner or in an indirect indication manner. For example, the direct indication manner may be: the SSD directly reports the remaining capacity of the SSD to the controller; the indirect indication manner may be: the SSD reports a change of the remaining capacity of the SSD to the controller, and the controller can also determine the remaining capacity of the SSD according to the change of the remaining capacity of the SSD.

In the prior art, data compression is performed by a controller, and the controller itself creates an address space to manage a capacity of an SSD. The address space is a fixed-length address space. Once the address space has been created, a size of the address space does not change. As a result, even if the SSD can notify the controller of a capacity increase brought by data compression, the controller cannot utilize an increased capacity, resulting in a waste of storage resources of the SSD. In this implementation manner, first, a compression function is transferred from the controller to the SSD, so that computational pressure of the controller can be reduced; second, a capacity management function of the SSD is transferred to the SSD, and the SSD feeds back a remaining capacity to the controller. Because the SSD can accurately obtain its own remaining capacity, a waste of storage resources of the SSD is avoided.

With reference to the first aspect, in some implementation manners of the first aspect, the method further includes: sending, by the SSD, second feedback information to the controller, where the second feedback information indicates a logical capacity of the SSD, and the logical capacity of the SSD is the sum of an uncompressed data volume of stored data in the SSD and a capacity of free physical space of the SSD.

With reference to the first aspect, in some implementation manners of the first aspect, before the sending, by the SSD, first feedback information to the controller, the method further includes: querying, by the SSD, the free physical space of the SSD; and determining, by the SSD, the capacity of the free physical space as the remaining capacity.

With reference to the first aspect, in some implementation manners of the first aspect, the method further includes: allocating, by the SSD, a blank logical block to the to-be-written data, where the blank logical block is a logical block with a free logical address, and each logical block corresponds to a segment of logical capacity of the SSD; converting, by the SSD, the blank logical block into a valid logical block, where the valid logical block is a logical block whose logical address is occupied by valid data; and querying, by the SSD, a quantity of remaining blank logical blocks in the SSD; and the sending, by the SSD, first feedback information to the controller, includes: sending, by the SSD, the first feedback information to the controller, where the first feedback information includes the quantity of the remaining blank logical blocks and/or the remaining capacity, and the remaining capacity is determined based on the quantity of the remaining blank logical blocks. It should be understood that, in this implementation manner, after allocating the blank logical block to the to-be-written data, the SSD may directly convert the blank logical block into the valid logical block; or after allocating the blank logical block to the to-be-written data, the SSD may first perform compression and storage operations on the to-be-written data, and then convert the blank logical block into the valid logical block.

With reference to the first aspect, in some implementation manners of the first aspect, the SSD records the logical block in the SSD according to a mapping table of the SSD.

With reference to the first aspect, in some implementation manners of the first aspect, the compressing, by the SSD, the to-be-written data to obtain compressed data, includes: after the allocating, by the SSD, a blank logical block to the to-be-written data, compressing, by the SSD, the to-be-written data to obtain the compressed data; and the method further includes: determining, by the SSD according to a size of the to-be-written data and a size of the compressed data, a quantity of blank logical blocks that need to be added in the SSD.

With reference to the first aspect, in some implementation manners of the first aspect, the method further includes: adding, by the SSD according to the quantity of the blank logical blocks that need to be added in the SSD, entries corresponding to new blank logical blocks to the mapping table of the SSD.

With reference to the first aspect, in some implementation manners of the first aspect, the method further includes: inserting, by the SSD according to the quantity of the blank logical blocks that need to be added in the SSD, entries corresponding to new blank logical blocks at the end of the mapping table of the SSD.

By maintaining the mapping table of a dynamically changing length, a change of the logical capacity of the SSD may be recorded conveniently.

With reference to the first aspect, in some implementation manners of the first aspect, the method further includes: updating, by the SSD, an isolated logical block in the SSD to a blank logical block according to the quantity of the blank logical blocks that need to be added in the SSD, where the isolated logical block is a logical block whose logical address cannot be used in the SSD.

Dynamically updating a status of a logical block in the mapping table may facilitate management of the logical block in the SSD.

With reference to the first aspect, in some implementation manners of the first aspect, the method further includes: receiving, by the SSD, a command from the controller, where the command includes a logical address range, and the command instructs to mark valid data in the logical address range as invalid data; and converting, by the SSD, a valid logical block in the logical address range into an isolated logical block, where the isolated logical block is a logical block whose logical address cannot be used. The command, for example, may be a trim/unmap (trim/unmap) command.

In this solution, logical blocks are classified into blank logical blocks, valid logical blocks, and isolated logical blocks. By updating and maintaining statuses of logical blocks in the SSD, not only data storage of the logical blocks in the SSD can be well reflected, but also a dynamic change of the logical capacity of the SSD can be well reflected.

With reference to the first aspect, in some implementation manners of the first aspect, the method further includes: determining, by the SSD, a size of physical space occupied by data in the logical address range; selecting, by the SSD, partial over-provisioning space from over-provisioning space, where a size of the partial over-provisioning space is equal to the size of the physical space occupied by the data in the logical address range; and using, by the SSD, the partial over-provisioning space as the free physical space of the SSD.

With reference to the first aspect, in some implementation manners of the first aspect, the quantity M of blank logical blocks that need to be added in the SSD is equal to a rounded-down result of dividing D by L, where D indicates a difference between a length of the to-be-written data and a length of the compressed data, and L indicates a length of a logical block in the SSD. M may be obtained by means of table lookup, or may be obtained by means of online computation.

With reference to the first aspect, in some implementation manners of the first aspect, the quantity M of blank logical blocks that need to be added in the SSD is equal to a result of dividing D by L, minus 1, where D indicates a difference between a length of the to-be-written data and a length of the compressed data, and L indicates a length of a logical block in the SSD. M may be obtained by means of table lookup, or may be obtained by means of online computation.

With reference to the first aspect, in some implementation manners of the first aspect, after the receiving, by the SSD, a write request from a controller, the method further includes: allocating, by the SSD, a logical address to the to-be-written data; and recording, by the SSD, mapping information in an entry in the mapping table, the entry corresponding to the logical address, where the mapping information includes information about a physical page storing the compressed data, a start position of the compressed data on the physical page, and the length of the compressed data.

A physical address of the compressed data can be directly located by using the foregoing mapping information, thereby improving addressing efficiency of the SSD.

With reference to the first aspect, in some implementation manners of the first aspect, after the receiving, by the SSD, a write request from a controller, the method further includes: allocating, by the SSD, a logical address to the to-be-written data; recording, by the SSD, mapping information in an entry in the mapping table, the entry corresponding to the logical address, where the mapping information includes information about a physical page storing the compressed data; and storing, by the SSD, metadata of the compressed data on the physical page, where the metadata includes a start position of the compressed data on the physical page and the length of the compressed data.

A mapping relationship between a logical address and a physical address of a data block is recorded jointly by the mapping table and the physical page, so that memory occupied by the mapping table in the SSD can be reduced, and memory space of the SSD can be saved.

With reference to the first aspect, in some implementation manners of the first aspect, the write request includes the data length of the to-be-written data, and the logical address of the to-be-written data is allocated based on the data length.

With reference to the first aspect, in some implementation manners of the first aspect, after the storing, by the SSD, the compressed data, the method further includes: sending, by the SSD, the logical address of the to-be-written data in the SSD to the controller.

With reference to the first aspect, in some implementation manners of the first aspect, the method further includes: receiving, by the SSD, a read request from the controller, where the read request includes a logical address of to-be-read data; reading, by the SSD, target data in a physical address corresponding to the logical address of the to-beread data; decompressing, by the SSD, the target data to obtain the to-be-read data; and sending, by the SSD, the to-be-read data to the controller.

With reference to the first aspect, in some implementation manners of the first aspect, before the sending, by the SSD, first feedback information to the controller, the method may further include: receiving, by the SSD, a query request message sent by the controller, where the query request is used to query the remaining capacity of the SSD; and the sending, by the SSD, first feedback information to the controller, includes: sending, by the SSD, a query response message to the controller, where the query response message includes the first feedback information. Specifically, the SSD receives a query message sent by the controller, where the query message is specifically used to query the quantity of the remaining blank logical blocks in the SSD; and sending, by the SSD, a query response message to the controller, where the query response message is used to indicate the quantity of the remaining blank logical blocks.

With reference to the first aspect, in some implementation manners of the first aspect, the sending, by the SSD, first feedback information to the controller, includes: actively sending, by the SSD, the first feedback information to the controller. Specifically, the SSD may actively send the quantity of the remaining blank logical blocks to the controller. It should be understood that, the SSD may periodically feed back the quantity of the remaining blank logical blocks to the controller, or reporting of the remaining blank logical blocks may be triggered by an event.

According to a second aspect, a storage apparatus is provided, where the storage apparatus includes a module configured to execute the method in the first aspect.

According to a third aspect, a solid state disk is provided, and includes a communications interface, a storage medium, and a processor, where the communications interface is configured to communicate with a controller, the storage medium is configured to provide storage space, and the processor is connected to the communications interface and the storage medium, and execute the method in the first aspect by using the communications interface and the storage medium.

According to a fourth aspect, a computer readable medium is provided, where the computer readable medium stores program code to be executed by a solid state disk, and the program code includes an instruction used to execute the method in the first aspect.

In the foregoing implementation manners, the mapping table may be used to indicate a logical address space of the SSD.

In the foregoing implementation manners, the logical block in the SSD is a basic unit of the logical address space of the SSD.

In the foregoing implementation manners, determining, by the SSD, the logical address of the to-be-written data, may include: allocating, by the SSD, N blank logical blocks to N data blocks in the to-be-written data, where the blank logical blocks are logical blocks with free logical addresses in the SSD, a length of each data block in the N data blocks is the same as a length of a logical block in the SSD, and N is an integer that is greater than or equal to 1; and using, by the SSD, the logical addresses of the N blank logical blocks as logical addresses of the to-be-written data.

In the prior art, all logical addresses of the SSD are allocated and managed by the controller. However, the SSD learns its own data storage and compression status best. Therefore, in this implementation manner, functions of allocating and managing the logical addresses of the SSD are transferred from the controller to the SSD, so that manners of allocating and managing the logical addresses of the SSD are more proper.

In the foregoing implementation manners, the allocating, by the SSD, N blank logical blocks to N data blocks in the to-be-written data, may include: randomly selecting, by the SSD, N blank logical blocks from logical blocks in the SSD.

In the foregoing implementation manners, the allocating, by the SSD, N blank logical blocks to N data blocks in the to-be-written data, may include: selecting, by the SSD, N blank logical blocks at the front according to positions of entries corresponding to the blank logical blocks in the mapping table.

In the foregoing implementation manners, the SSD may partition the to-be-written data according to a preset compression granularity, to obtain N data blocks, where the compression granularity is equal to a length of a logical block in the SSD, and N is an integer that is greater than 1. The compression granularity may specifically indicate a compression unit of a data block in the SSD, that is, a size used as a unit for compression.

The compression granularity is set to a value equal to the length of the logical block, thereby simplifying implementation inside the SSD, and facilitating management of the mapping table.

In the prior art, data compression is performed by a controller, and the controller itself creates an address space to manage a capacity of an SSD. The address space is a fixed-length address space. Once the address space has been created, a size of the address space does not change. As a result, even if the SSD can notify the controller of a capacity increase brought by data compression, the controller cannot utilize an increased capacity, resulting in a waste of storage resources of the SSD. In the embodiments of the present invention, first, a compression function is transferred from a controller to an SSD, so that computational pressure of the controller can be reduced; second, a capacity management function of the SSD is transferred to the SSD, and the SSD feeds back a remaining capacity to the controller. Because the SSD can accurately obtain its own remaining capacity, a waste of storage resources of the SSD is avoided.

BRIEF DESCRIPTION OF DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

It should be noted that, a disk (disk) in the embodiments of the present invention may refer to an SSD, and a disk array may refer to an SSD array.

Figure 1:
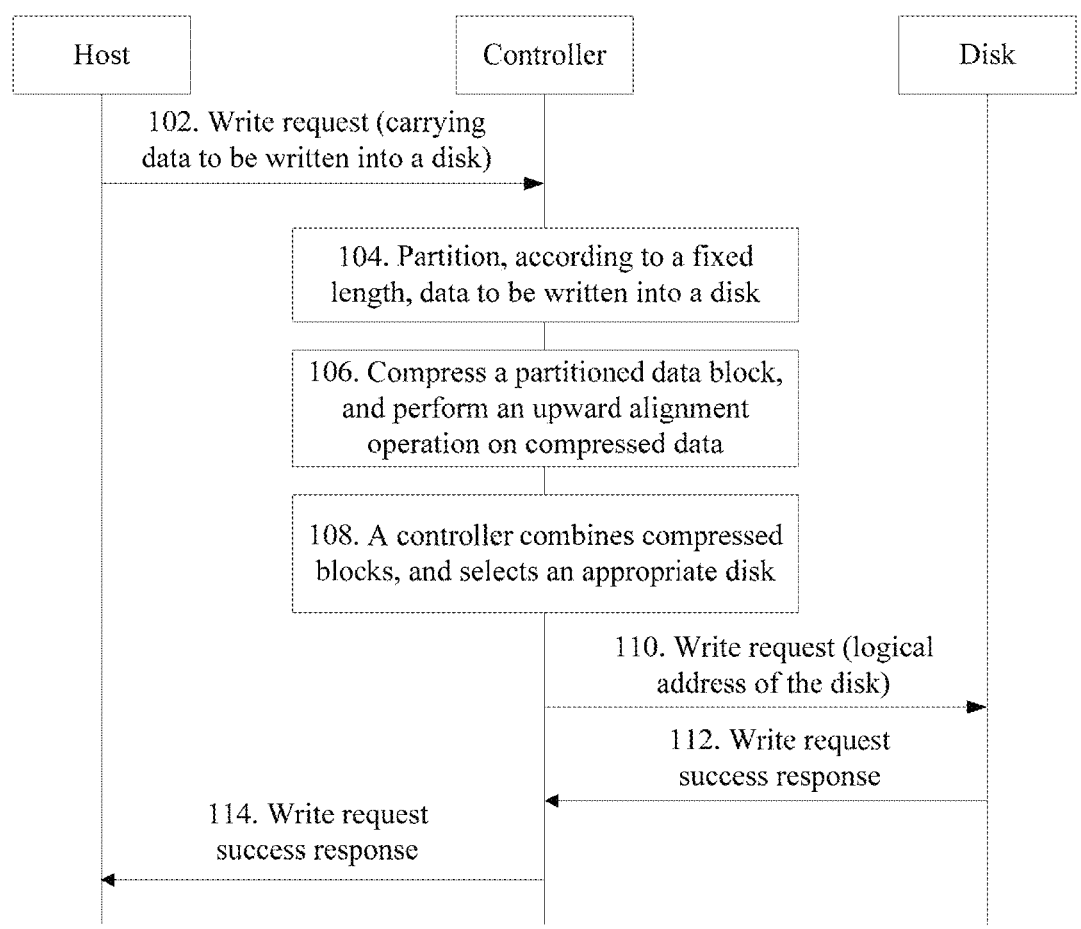
FIG. 1 is a flowchart of processing, by a storage system, a write request of a host.
Figure 2:
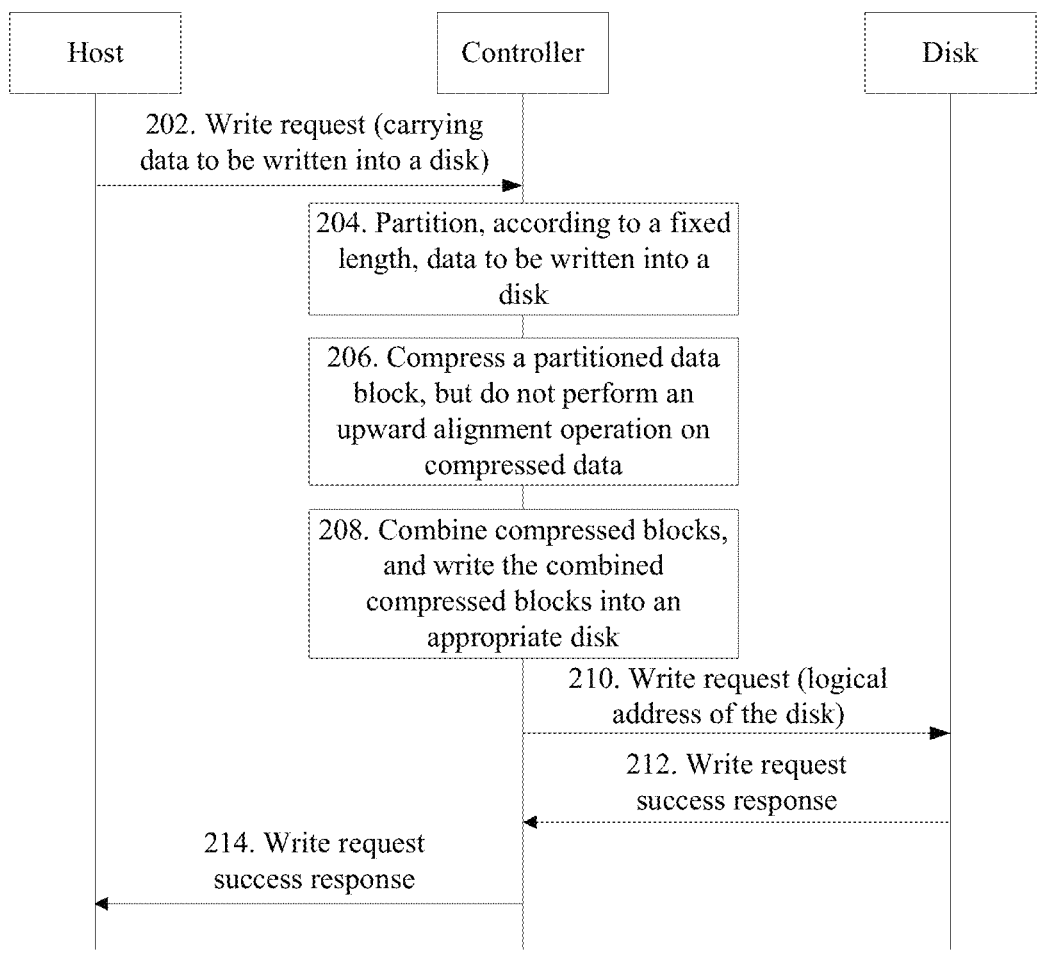
FIG. 2 is a flowchart of processing, by a storage system, a write request of a host.

For ease of understanding, a data compression manner in an existing storage system is first described briefly with reference to FIG. 1 and FIG. 2.

FIG. 1 is a flowchart of processing, by a storage system, a write request (or referred to as IO) of a host. The storage system in FIG. 1 is a storage system based on fixed-length compression. Fixed-length compression may compress a data block into one or more fixed-length compressed blocks. For example, assuming that a compression granularity of the storage system is 4 KB (that is, 4 KB is used as a unit for compression), the storage system based on fixed-length compression compresses a 4 KB data block into an integer multiple of 0.5 KB. For example, the 4 KB data block is compressed into one of the following granularities: 0.5 KB, 1 KB, 1.5 KB, 2 KB, 3 KB, 3.5 KB, or 4 KB (when a compressed size of the 4 KB data block is greater than 3.5 KB, the data block does not need to be compressed). Specifically, assuming that a compressed length of the 4 KB data block is between 0.5 KB and 1 KB, an upward alignment operation needs to be performed on the data block to obtain a 1 KB data block. A specific manner of upward alignment may be adding 0 to the end of compressed data, to stuff the compressed data to 1 KB. It should be understood that, a compression granularity of a data block may also be any other granularity such as 8 KB or 16 KB, and a data block of each compression granularity may be compressed into an integer multiple of 0.5 KB, an integer multiple of 1 KB, or the like. This is not specifically limited in the embodiments of the present invention. The following mainly uses an example in which at a compression granularity of 4 KB, a 4 KB to be compressed block is compressed into one of 0.5 KB, 1 KB, 1.5 KB, 2 KB, 3 KB, 3.5 KB, or 4 KB for description.

102. A host sends a write request to a controller.

The write request may include data to be written into a disk. The controller may also be referred to as a storage controller, and may manage disks that provide physical storage space. If the disks form an array, the controller may also be referred to as an array controller.

104. The controller partitions, according to a fixed length, data to be written into a disk.

In some embodiments, the data to be written into the disk may be partitioned according to a compression granularity, to generate a data block. For example, if the compression granularity is 4 KB, 4 KB is used as a unit to partition the data to be written into the disk.

106. The controller compresses a partitioned data block, and performs an upward alignment operation on compressed data.

Assuming that a length of compressed data formed after a 4 KB data block is compressed is less than 0.5 KB, a round-up operation may be performed on the compressed data, and the compressed data is stuffed to a 0.5 KB compressed block.

108. The controller rounds compressed blocks, and selects an appropriate disk.

For example, the compressed blocks may be rounded in a unit of a size of a physical page (herein a 4 KB physical page is used as an example for description). A write request may be generated every time a 4 KB data block is obtained by means of rounding. Then data carried in one or more generated write requests may be written into the selected disk at a time. Alternatively, after a plurality of 4 KB data blocks is obtained by means of rounding, the data blocks are written into the selected disk at a time.

In addition, the controller needs to select a disk for storing the rounded data. There may be a plurality of policies or manners for searching for a disk. For example, the controller may select a disk randomly from a disk array, provided that remaining space of the disk is ensured greater than a length of data to be written into the disk. Alternatively, the controller selects an appropriate disk based on factors such as a current data storage volume of disks in the disk array, so that data stored on the disks is even.

110. The controller sends a write request to the selected disk.

The write request may include the data to be written into the disk, and a logical address of the disk allocated by the controller to the data in the write request.

112. After being processed in the foregoing steps, data finally reaches the disk, and the disk writes the data into a physical address of the disk, and returns a write request success response to the controller.

114. The controller feeds back the write request success response to the host.

FIG. 2 is a flowchart of processing, by a storage system, a write request of a host. The storage system in FIG. 2 is a storage system based on variable-length compression. Different from fixed-length compression, variable-length compression does not require a data block to be compressed to a fixed length. A compression granularity of 4 KB is still used as an example, and assuming that a compressed length of a 4 KB data block is 2778 B, the 2778 B data block does not need to be adjusted, that is, the compressed length is unchanged. Steps 202 to 214 in FIG. 2 are basically similar to steps 102 to 114 in FIG. 1, and to avoid repetition, details are not described herein again. A main difference between FIG. 1 and FIG. 2 lies in that variable-length compression is performed on the data block in step 206, but fixed-length compression is performed on the data block in step 106.

Both FIG. 1 and FIG. 2 describe a write request processing procedure. When the host needs to read data from the disk, the host sends a read request to the controller. After receiving the read request, the controller first obtains data from the disk, then decompresses the data, and returns decompressed data to the host. A read request processing procedure is an inverse process of the write request processing procedure, and to avoid repetition, details are not described in detail herein again.

Based on the foregoing description, it can be learned that the compression and decompression functions are mainly implemented by the controller in the prior art. As a data processing scale of the storage system is increasingly large, the compression and decompression functions need to consume a large quantity of computing resources of the controller. As a result, a delay in processing the write request by the controller is longer, and further, overall performance of the storage system is reduced.

With development of technologies, an SSD becomes one of storage media mainly used by a disk array. One of differences between the SSD and a conventional hard disk drive (Hard Disk Drive, HDD) lies in that the SSD includes a processor having a data processing capability. In some cases, the processor of the SSD is mainly configured to perform simple functions such as block management, garbage collection, wear leveling, and conversion between a logical address and a physical address. However, with development of technologies, the processing capability of the processor in the SSD becomes increasingly strong, and the processing capability of the processor in the SSD cannot be brought into full play if the SSD is used to perform only the foregoing functions. Therefore, to fully utilize the processing capability of the processor in the SSD, and reduce load of the controller, the data compression and decompression functions may be transferred to the SSD. Therefore, in the embodiments of the present invention, both the data compression and decompression functions may be implemented by the SSD. The following describes in detail a composition structure of a storage system in an embodiment of the present invention and functions of components in the storage system with reference to FIG. 3.

Figure 3:
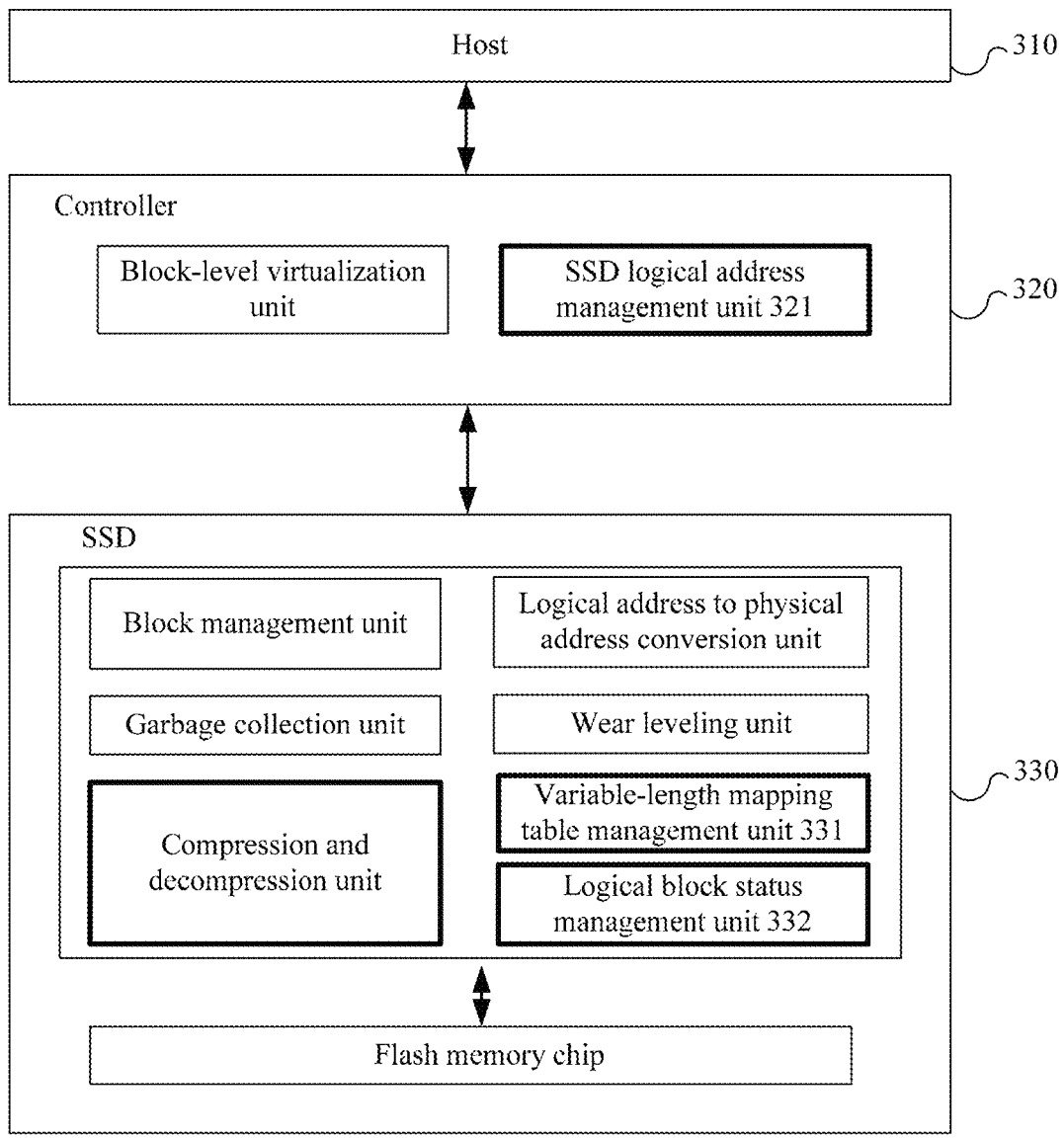
FIG. 3 is a schematic structural diagram of a storage system according to an embodiment of the present invention.

FIG. 3 is a schematic structural diagram of a storage system according to an embodiment of the present invention. The storage system in FIG. 3 includes a host (host) 310, a controller 320, and an SSD 330. As can be seen from FIG. 3, the controller 320 is located between the host 310 and the SSD 330, and as a bridge, implements data exchange between the host 310 and the SSD 330.

In some embodiments, the controller 320 may include components such as a central processing unit (Central Processing Unit, CPU) (or another chip having a computing capability, for example, a field programmable gate array (Field Programmable Gate Array, FPGA)) and a cache (Cache). The controller 320 in FIG. 3 is separated from the host. However, this embodiment of the present invention is not limited thereto. The controller 320 may be an independent hardware device, or may be a software module integrated on the host 310. In addition, the controller 320 may be connected to one or more SSDs.

Still referring to FIG. 3, the SSD may include a flash memory chip (the flash memory chip is a storage medium in the SSD). The SSD (or a processor in the SSD) may include a block management unit, configured to manage blocks in the SSD, where a block (block) is a basic erasure unit in the SSD. For example, the SSD maintains an identifier of a block in the SSD by using the block management unit, erases a block after garbage collection, and records and replaces a bad block in the SSD. The SSD may further include a logical address to physical address conversion unit, configured to implement addressing of data inside the SSD. A garbage collection unit is configured to perform garbage collection on invalid data in the SSD, for example, move valid data in a block to another block. A wear leveling unit is configured to control write/erase cycles of blocks in the SSD, so that wear degrees (namely, write/erase cycles) of the blocks in the SSD are as even as possible.

Further, to implement the data compression and decompression functions in the SSD, a compression and decompression unit may be added to the SSD. In some embodiments, when receiving a write request of the controller, the SSD may first compress to-be-written data in the write request, and then write compressed data into the flash memory chip in the SSD. When receiving a read request of the controller, the SSD may read data from the flash memory chip in the SSD, then decompress the read data, and return decompressed data to the controller.

Data compression in the SSD is accompanied with a change of a logical capacity of the SSD. In some embodiments, it is assumed that the controller learns that the logical capacity of the SSD is 400 GB, but in the SSD, the received 400 GB data is compressed according to a compression ratio of 4:1, and 100 GB compressed data is obtained. If the controller fails to learn that the disk can still store 300 GB data in this case, that is, the disk still has a logical capacity of 300 GB in this case, a waste of SSD resources is caused. The following explains a cause of the problem.

First, for better description, three types of capacities related to an SSD, that is, a medium capacity, a physical capacity, and a logical capacity, are first described.

Medium capacity: a total capacity of the flash memory chip in the SSD. For example, for an SSD with nominal 400 GB, a capacity of a flash memory chip in the SSD is generally greater than 400 GB, for example, may be 512 GB. That is, in a 512 GB medium capacity, there is 112 GB over-provisioning (OP) space, or referred to as redundant space. The over-provisioning space is used to improve reliability of the SSD, and generally cannot be used by a user. Certainly, redundancy ratios used when different manufacturers design the SSD are different, so that the size of the over-provisioning space of the SSD also changes. The over-provisioning space may be used for data moving during bad block replacement or garbage collection.

Physical capacity: a nominal available capacity of the SSD. It is equivalent to a capacity of a storage medium that can be used for storing data in the SSD by the user. For example, for an SSD with nominal 400 GB, a corresponding physical capacity is 400 GB. Regardless of whether the SSD compresses data before the data is stored, the physical capacity of the SSD is unchanged.

Logical capacity: a total volume of data that can be actually stored in the SSD, or a capacity of the SSD that can be used for storing data. If the SSD does not compress the data, the logical capacity is generally equal to the physical capacity. If the SSD compresses the data before storing the data, the logical capacity of the SSD is equal to the sum of a capacity of free physical space of the SSD and an uncompressed data volume of the stored data in the SSD. Therefore, the logical capacity changes dynamically. For example, for an SSD with a physical capacity of 400 GB, size of the data is 1200 GB, then the data is compressed, a size of compressed data actually stored in the SSD is 400 GB, thus the logical capacity of the SSD is 1200 GB. The logical capacity is related to a compression ratio of data stored in the disk, and dynamically changes as different data is stored.

For ease of understanding, the following describes a manner of calculating a change of the logical capacity of the SSD separately by using fixed-length compression and variable-length compression as an example.

Assuming that a nominal physical capacity of an SSD is 400 GB, an initial logical capacity of the SSD is equal to 400 GB. A compression granularity of 4 KB is still used as an example, for a compression status of a 4 KB data block, an increment of the logical capacity of the SSD may be calculated in the following several manners:

1. A 4 KB data block is compressed into a 0.5 KB compressed block: An increment of the logical capacity of the SSD is 4 KB–0.5 KB=3.5 KB.
2. A 4 KB data block is compressed into a 1 KB compressed block: An increment of the logical capacity of the SSD is 4 KB–1 KB=3 KB.
3. A 4 KB data block is compressed into a 1.5 KB compressed block: An increment of the logical capacity of the SSD is 4 KB–1.5 KB=2.5 KB.
4. A 4 KB data block is compressed into a 2 KB compressed block: An increment of the logical capacity of the SSD is 4 KB–2 KB=2 KB.
5. A 4 KB data block is compressed into a 2.5 KB compressed block: An increment of the logical capacity of the SSD is 4 KB–2.5 KB=1.5 KB.
6. A 4 KB data block is compressed into a 3 KB compressed block: An increment of the logical capacity of the SSD is 4 KB–3 KB=1 KB.
7. A 4 KB data block is compressed into a 3.5 KB compressed block: An increment of the logical capacity of the SSD is 4 KB–3.5 KB=0.5 KB.

The following provides a specific example of calculating an increment of the logical capacity of the SSD.

Assuming that there are 4 M 4 KB data blocks, a total length of these data blocks is 16 GB.

Assuming that a total of 1 M data blocks in these data blocks are compressed to 2 KB each, an increment of the logical capacity of the SSD is: 1 M*(4 KB–2 KB)=2 GB.

Assuming that a total of 1 M data blocks in these data blocks are compressed to 1.5 KB each, an increment of the logical capacity of the SSD is: 1 M*(4 KB–1.5 KB)=2.5 GB.

Assuming that a total of 1 M data blocks in these data blocks are compressed to 1 KB each, an increment of the logical capacity of the SSD is: 1 M*(4 KB–1 KB)=3 GB.

Assuming that a total of 1 M data blocks in these data blocks are compressed to 0.5 KB each, an increment of the logical capacity of the SSD is: 1 M*(4 KB–0.5 KB)=3.5 GB.

In conclusion, a total of 16 GB data is stored into the SSD. Because of compression, a physical capacity actually occupied by the 16 GB data is 2 GB+1.5 GB+1 GB+0.5 GB=5 GB. In this case, an increment of the logical capacity of the SSD is 2 GB+2.5 GB+3 GB+3.5 GB=11 GB, and the logical capacity changes to 411 GB.

In variable-length compression, compressed sizes of a 4 KB data block may be compressed variable lengths such as 2778 B, 1678 B, 2012 B, and 1212 B. For a compression status of a 4 KB data block, the following provides an example of a manner of calculating an increment of the logical capacity of the SSD.

1. A 4 KB data block is compressed into a 2778 B compressed block: An increment of the logical capacity of the SSD is 4096 B–2778 B=1318 B.
2. A 4 KB data block is compressed into a 1678 B compressed block: An increment of the logical capacity of the SSD is 4096 B–1678 B=2418 B.
3. A 4 KB data block is compressed into a 2012 B compressed block: An increment of the logical capacity of the SSD is 4096 B–2012 B=2084 B.
4. A 4 KB data block is compressed into a 1212 B compressed block: An increment of the logical capacity of the SSD is 4096 B–1212 B=2884 B.

It can be learned from the foregoing description that, regardless of fixed-length compression or variable-length compression, the logical capacity of the SSD changes dynamically according to the compression status of data blocks. Certainly, in addition to data compression, a trim/unmap operation may also change the logical capacity of the SSD. The trim/unmap operation is described below in detail.

In conclusion, the logical capacity of the SSD changes dynamically according to the compression status of data. If the controller cannot learn the dynamic change of the logical capacity of the SSD, and if the controller cannot perceive the increase of the logical capacity, but still consider the logical capacity of the SSD unchanged as does in the prior art, storage space saved by means of compression cannot be fully utilized, and a waste of storage space of the SSD is caused. Therefore, how to design a set of solutions allowing cooperation between the controller and the SSD and enabling the SSD to detect and manage the dynamically changing logical capacity and present the dynamic change of the logical capacity of the SSD to the controller is a problem that needs to be considered when the compression and decompression functions are transferred to the SSD.

To resolve the foregoing problem, a variable-length mapping table management unit 331 and a logical block status management unit 332 (referring to FIG. 3) may be added to the SSD, and an SSD logical address management unit 321 may be added to the controller. The following describes functions of these units in detail.

The variable-length mapping table management unit 331 may be configured to manage and maintain a mapping table of the SSD. The mapping table reflects a logical address space of the SSD. The mapping table includes one or more entries (or referred to as items). Each entry corresponds to a logical address range in the logical address space. The logical address range corresponding to each entry in the mapping table is a basic granularity of the mapping table. For example, assuming that each entry corresponds to a 4 KB logical address range, the basic granularity of the mapping table is 4 KB. Generally, each entry corresponds to one logical block. The logical address range corresponding to each entry is referred to as a logical block address (Logical Block Address, LBA). In addition, the mapping table may be used to map an LBA to a physical block address (Physical Block Address, PBA), and a mapping relationship recorded in the mapping table may be used to implement data addressing. In this embodiment of the present invention, a length of the mapping table of the SSD may change dynamically as the logical capacity of the SSD changes.

Further, compression and decompression processes in the SSD may be masked by using the mapping table. In some embodiments, the mapping table of the SSD reflects a storage status of data in the logical address space of the SSD, and a size of an occupied logical address space depends on an original size (an uncompressed size) of the data. That is, no compression phenomenon exists in storage of the data in the logical address space, and this is equivalent to masking the compression process of the data by the SSD by using the mapping table.

In addition, the basic granularity of the mapping table may keep consistent with the compression granularity. The mapping table may be located in the memory in the SSD.

Still referring to FIG. 3, the logical block status management unit 332 may be configured to manage and maintain a status of a logical block in the SSD. In some embodiments, the SSD may include logical blocks in three states: a blank logical block (or referred to as a blank block), a valid logical block (or referred to as a valid block), and an isolated logical block (or referred to as an isolated block). It should be understood that, a blank logical block may refer to a logical block with a free logical address. A quantity of blank logical blocks may reflect a remaining logical capacity of the SSD; or a quantity of blank logical blocks may reflect remaining available space of the SSD. In addition, the quantity of the blank logical blocks may dynamically change as the logical capacity of the SSD changes. Therefore, a dynamic change of the quantity of the blank logical blocks may be used as a metric of the dynamic change of the logical capacity of the SSD. A valid logical block may refer to a logical block whose logical address stores valid data, and the valid data may refer to data that is not trimmed or unmapped. An isolated logical block may refer to a logical block whose logical address cannot be used, for example, a logical block whose logical address is occupied by invalid data. The invalid data may be, for example, data that is marked as invalid by a trim/unmap operation.

Figure 4:
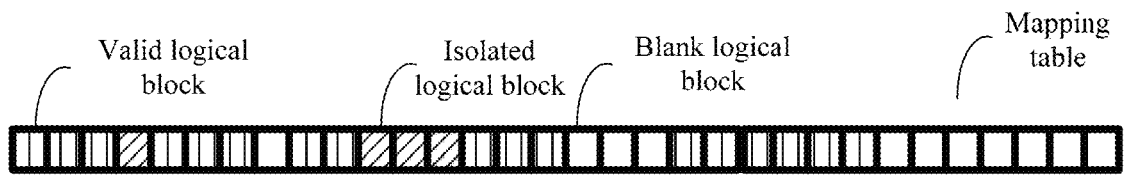
FIG. 4 is a diagram of an example of a mapping table according to an embodiment of the present invention.

In some embodiments, the mapping table of the SSD may use a form shown in FIG. 4 to present a one-dimensional logical address space of the SSD. A square box in FIG. 4 represents a basic granularity of the mapping table. The basic granularity may be 4 KB/8 KB/16 KB/32 KB/64 KB, or the like. A length of the one-dimensional logical address space presented by the mapping table may be variable, that is, may increase or decrease dynamically. In addition, the mapping table may include an isolated logical block, and the isolated logical block in FIG. 4 is identified by diagonal stripes. Data in a logical address range corresponding to the isolated logical block is invalid data, and the logical address corresponding to the isolated logical block cannot be used temporarily.

A logical block in the SSD may transit between the foregoing three states. The following describes a state transition process of a logical block in the SSD in detail with reference to FIG. 5.

First, when a logical address corresponding to a logical block is unused, the logical block is a blank logical block. If a logical address of a blank logical block is used for storing valid data, the blank logical block changes into a valid logical block.

Next, the valid logical block may change into an isolated logical block because of a trim/unmap operation (for a detailed description about the trim/unmap operation, refer to the following trim/unmap procedure). Consider the following scenario: First, a batch of data with a compression ratio of 4 is written into the SSD, and then a batch of data that cannot be compressed is written into the SSD. Assuming that the physical capacity of the SSD is 400 GB, when the data with the compression ratio of 4 is written into the SSD, the SSD can actually store 1600 GB data. In this case, the logical capacity of the SSD is expanded from 400 GB to 1600 GB. In this case, the logical address space reflected by the mapping table is 1600 GB. Then data in the SSD is updated, and 400 GB data that cannot be compressed is stored into the SSD. In this case, the SSD can actually store only 400 GB data. In this case, the logical capacity corresponding to the SSD is reduced from 1600 GB to 400 GB again. During reduction of the logical capacity, a part of the logical address space certainly becomes invalid, and an isolated logical block is generated in the logical address space.

Next, as the logical capacity of the SSD increases, the isolated logical block may be updated to a blank logical block again. In some embodiments, when the logical capacity of the SSD increases, the logical address range of the SSD increases, and correspondingly, the quantity of the blank logical blocks in the SSD increases. In this case, it may be preferentially considered to update an isolated logical block in the mapping table to a blank logical block. When all isolated logical blocks in the mapping table are updated to blank logical blocks, entries corresponding to new blank logical blocks may be added at the end of the mapping table, that is, the blank logical blocks are added.

Figure 6:
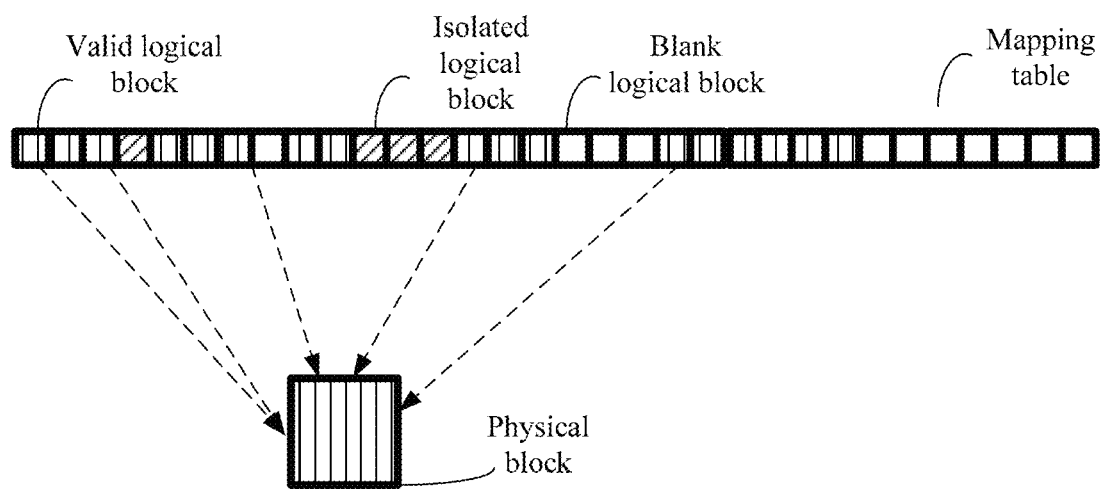
FIG. 6 is a diagram of an example of mapping between a logical block and a physical block according to an embodiment of the present invention.

The mapping table may record a mapping relationship from a logical address to a physical address of the SSD. The mapping relationship may be In some embodiments reflected by a mapping relationship between a logical address of a logical block and a physical address of a physical block. A size of a physical block in the SSD may be set according to a requirement. For example, a physical block may include: ¼ physical page, ½ physical page, one physical page, a plurality of physical pages, one block (block), or a plurality of blocks. A mapping relationship from a logical block to a physical block may be that a plurality of logical blocks is mapped to one physical block, that is, a many-to-one mapping relationship. It should be understood that, the SSD may divide a physical address range of the SSD into one or more physical blocks according to a physical block size. FIG. 6 shows one of physical blocks. Referring to FIG. 6, regardless of whether the SSD supports fixed-length compression or variable-length compression, each logical block may correspond to one physical block, and a plurality of compressed blocks may be stored in each physical block.

Mapping information in the mapping table may indicate a storage location of a compressed block in a physical block. There may be a plurality of specific forms of the mapping information. For example, the mapping information may include information such as information about a physical page storing a compressed block (for example, an identifier or a number of the physical page), a start position of the compressed block on the physical page, and a length of the compressed block. In this indication manner, the compressed block may be located quickly, and addressing efficiency is high. Optionally, the mapping information may include the information about the physical page storing the compressed block. The start position of the compressed block on the physical page and the length of the compressed block may be stored on the physical page as metadata, for example, may be stored in a header of the physical page. Because the mapping table is generally stored in memory space of the SSD, if only physical page information in the mapping information is stored, the length of the mapping table may be reduced, and memory space of the SSD may be saved. Regardless whether the SSD supports variable-length compression or fixed-length compression, one or more of the foregoing implementation manners may be used for the mapping information in the SSD. This is not In some embodiments limited in this embodiment of the present invention. Details are described below with reference to a specific example.

Still referring to FIG. 3, the SSD logical address management unit 321 in the controller may be configured to monitor or query the remaining logical capacity of the SSD, or a change of the logical capacity of the SSD. In some embodiments, the SSD logical address management unit 321 may learn the change of the logical capacity of the SSD by monitoring or querying the quantity of the blank logical blocks in the SSD. The controller may monitor or query a quantity of blank logical blocks in an SSD in a plurality of manners. The following provides several optional solutions. In practice, one or more of the following solutions may be selected.

Solution 1: The controller detects a quantity of blank logical blocks in an SSD in real time. In some embodiments, when the controller detects that a quantity (it should be understood that, herein the quantity refers to a quantity of remaining blank logical blocks in an SSD that is recorded by the controller, and the quantity may be unequal to a quantity of actual remaining blank logical blocks in the SSD) of blank logical blocks in the SSD that is recorded by the controller is less than a specified threshold (for example, 100), the controller actively queries the quantity of the blank logical blocks from the SSD. For example, in a previous query, the controller learns that an SSD includes 500 blank logical blocks. In a subsequent data writing process, the controller may keep updating a quantity of remaining blank logical blocks in the SSD that is recorded by the controller. When the controller finds that the quantity of the remaining blank logical blocks in the SSD that is recorded by the controller is less than 100, the controller may actively query the actual quantity of remaining blank logical blocks in the SSD from the SSD.

Solution 2: The controller determines, according to a size of a data volume corresponding to a trim/unmap area, whether to query a quantity of blank logical blocks in an SSD. For example, the controller records a trimmed or unmapped data volume, and every time a trimmed or unmapped data volume reaches 1 GB, the controller actively queries the quantity of the blank logical blocks in the SSD.

Solution 3: The controller determines, according to a data volume written into an SSD, whether to query a quantity of blank logical blocks in the SSD. For example, every time the controller writes a 1 GB data volume into the SSD, the controller actively queries the quantity of the blank logical blocks in the SSD.

Solution 4: An SSD actively reports a quantity of blank logical blocks. For example, the SSD may report the quantity of the blank logical blocks in the SSD periodically; or when a change of the quantity of the blank logical blocks exceeds a threshold, the SSD reports the quantity of the current blank logical blocks to the controller.

The following describes in detail an implementation manner of a compression process in an SSD separately by using fixed-length compression and variable-length compression as an example.

Fixed-Length Compression Implementation Manner

Figure 7:
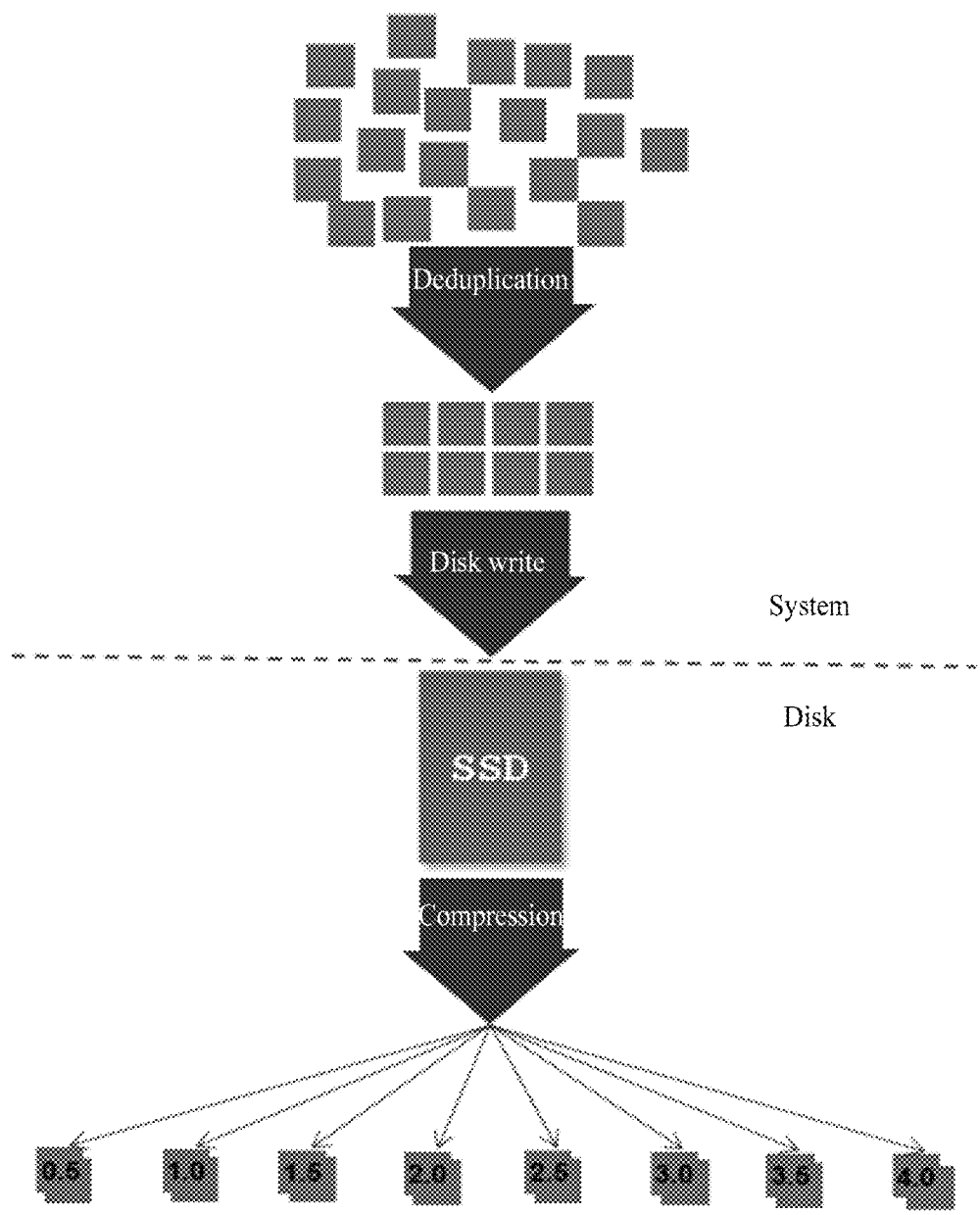
FIG. 7 is a diagram of an example of a compression procedure in a fixed-length compression system according to an embodiment of the present invention.

First, a compression processing procedure in a fixed-length compression system is described with reference to FIG. 7. As shown in FIG. 7, a system including a controller is located above a dashed line; and a disk including one or more SSDs is located below the dashed line. In FIG. 7, a compression granularity of 4 KB is still used as an example for description. In practice, other compression granularities such as 8 KB and 16 KB may also be used, and are not In some embodiments limited in this embodiment of the present invention.

In some embodiments, the controller may first receive data that needs to be stored into the disk from a host, and then perform deduplication on the data (that is, delete duplicate data; for a specific deduplication manner, refer to the prior art). Next, the controller does not compress de-duplicated data, but directly sends the de-duplicated data to the SSD, and the SSD performs compression processing. The SSD compresses the data by using 4 KB as a unit, and a size of compressed data varies with a compression ratio of data. Because the SSD uses the fixed-length compression manner, an upward alignment operation needs to be performed on the compressed data, so that a length of the compressed data is an integer multiple of 0.5 KB. For example, if the size of the compressed data is between 0.5 KB and 1 KB, according to an upward alignment principle, the compressed data needs to be stuffed to 1 KB, and a 1 KB compressed block is obtained.

Figure 8:
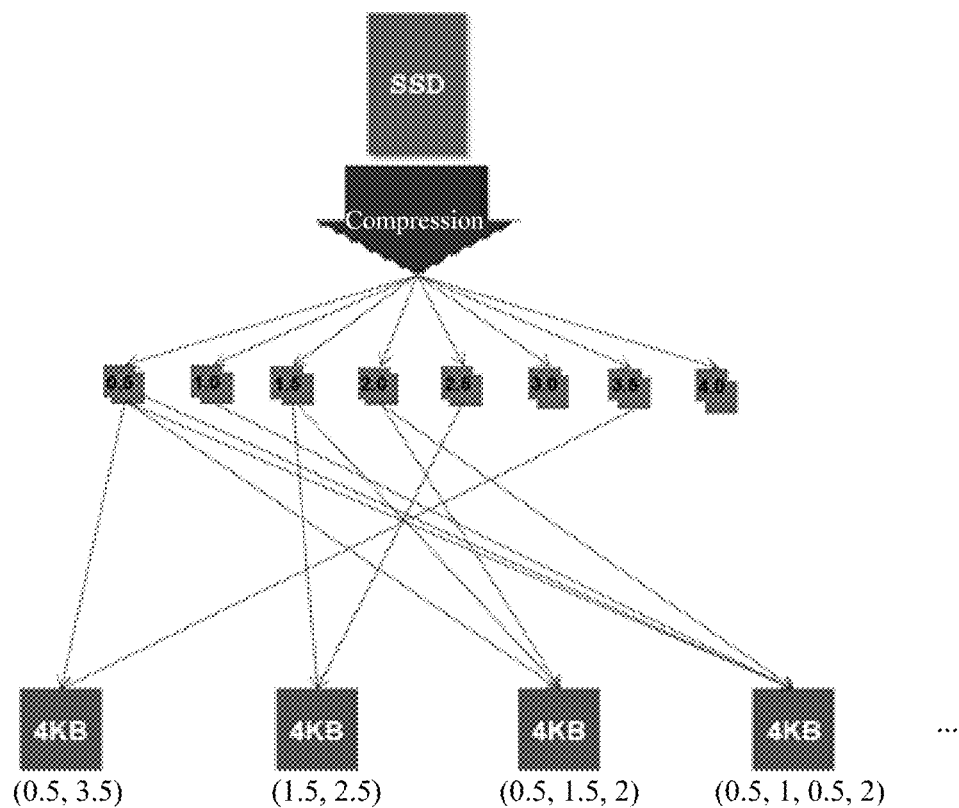
FIG. 8 is a diagram of an example of a manner of rounding compressed blocks according to an embodiment of the present invention.

Next, the compressed block needs to be written into a physical address of the SSD. It should be understood that, the SSD generally uses a physical page as a basic read or write unit. A size of the physical page is related to a type of the SSD, and is not In some embodiments limited in this embodiment of the present invention. In this embodiment of the present invention, a 4 KB physical page is used as an example for description. Before data is written into a physical page, compressed blocks may be rounded (or regrouped) by using 4 KB as a unit, to round the compressed blocks rounded into a 4 KB size. In this way, a group of rounded compressed blocks may be conveniently written into a 4 KB physical page at a time. FIG. 8 provides some manners of rounding compressed blocks. The following further provides some optional implementation manners of rounding a plurality of compressed blocks into one physical page.

Two compressed blocks are rounded into one physical page:

(0.5 KB, 3.5 KB), (1 KB, 3 KB), (1.5 KB, 2.5 KB), (2 KB, 2 KB).

Three compressed blocks are rounded into one physical page:

(1 KB, 1 KB, 2 KB), (0.5 KB, 1.5 KB, 2 KB), (0.5 KB, 1 KB, 2.5 KB), (0.5 KB, 0.5 KB, 3 KB).

Four compressed blocks are rounded into one physical page:

(0.5 KB, 0.5 KB, 1.5 KB, 1.5 KB), (0.5 KB, 1 KB, 0.5 KB, 2 KB), (0.5 KB, 1.5 KB, 1 KB, 1 KB), (0.5 KB, 2.5 KB, 0.5 KB, 0.5 KB).

For data received from the controller, the SSD not only needs to align and compress the data at a compression granularity, but also needs to allocate a logical address of the data in the SSD to the data, and record a mapping relationship between the logical address and a physical address of the data.

Figure 9:
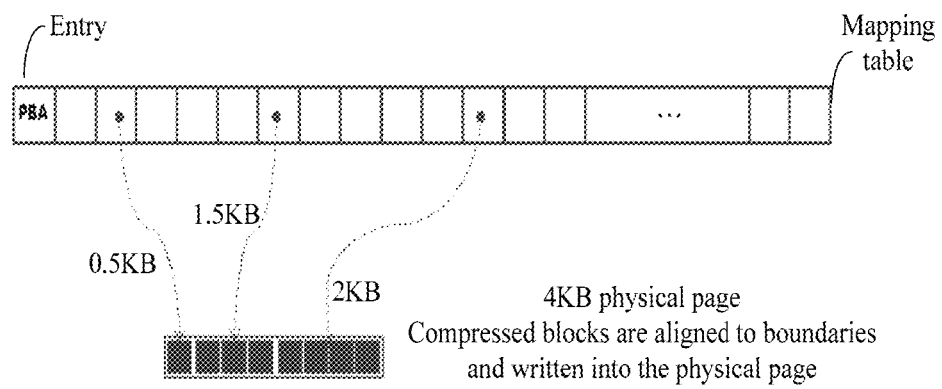
FIG. 9 is a diagram of an example of a manner of storing mapping information according to an embodiment of the present invention.

In some embodiments, referring to FIG. 9, mapping information may be recorded in an entry of a mapping table, and the SSD may directly convert the logical address into the physical address of the data by using the mapping information, to address the data. The mapping information may include information about a physical page, a start address of a compressed block on the physical page, and a length of the compressed block.

It should be noted that, the information about the physical page may be a number of the physical page. A physical page may have a globally unique number; or a physical block has a globally unique number, but a number of a physical page is unique in the physical block.

If the mapping information recorded in the entry of the mapping table includes the foregoing three types of information, for a 4 KB physical page, an SSD with a medium capacity of 512 GB requires approximately 34 bits (bit) to record a piece of mapping information. Specific analysis is as follows:

For the 4 KB physical page, because 512 GB corresponds to 128 M 4 KB, approximately 28 bits are required for addressing of the 4 KB physical page.

For the start address of the compressed block on the physical page, because boundary alignment is performed on the start address of the compressed block according to 0.5 KB in the fixed-length compression implementation manner, there are eight possibilities of the start address of the compressed block on the physical page, namely, start addresses corresponding to 0, 0.5 KB, 1 KB, 1.5 KB, 2 KB, 2.5 KB, 3 KB, and 3.5 KB. In this case, all possibilities of the start address of the compressed block on the physical page can be indicated by using 3 bits.

For the length of the compressed block, because all compressed blocks are integer multiples of 0.5 KB, there are eight possibilities of the length of the compressed block, namely, 0.5 KB, 1 KB, 1.5 KB, 2 KB, 2.5 KB, 3 KB, 3.5 KB, and 4 KB. Therefore, all possibilities of the length of the compressed block can be indicated by using 3 bits.

It can be learned from the foregoing description that, to locate a compressed block (for example, a 0.5 KB or 1.5 KB compressed block), mapping information of approximately 34 bits is required. It should be noted that, a quantity of bits required by a piece of mapping information varies according to a capacity and/or a compression granularity of the SSD. This is not In some embodiments limited in this embodiment of the present invention.

Variable-Length Compression Implementation Manner

In variable-length compression, an upward alignment operation does not need to be performed on compressed data, and a size of a compressed block may be kept the same and not aligned upwards. 4 KB is stilled used as an example, and assuming that compressed data sizes of a 4 KB data block are 2778 B and 3600 B, lengths of compressed blocks may be kept at 2778 B and 3600 B.

Figure 10:
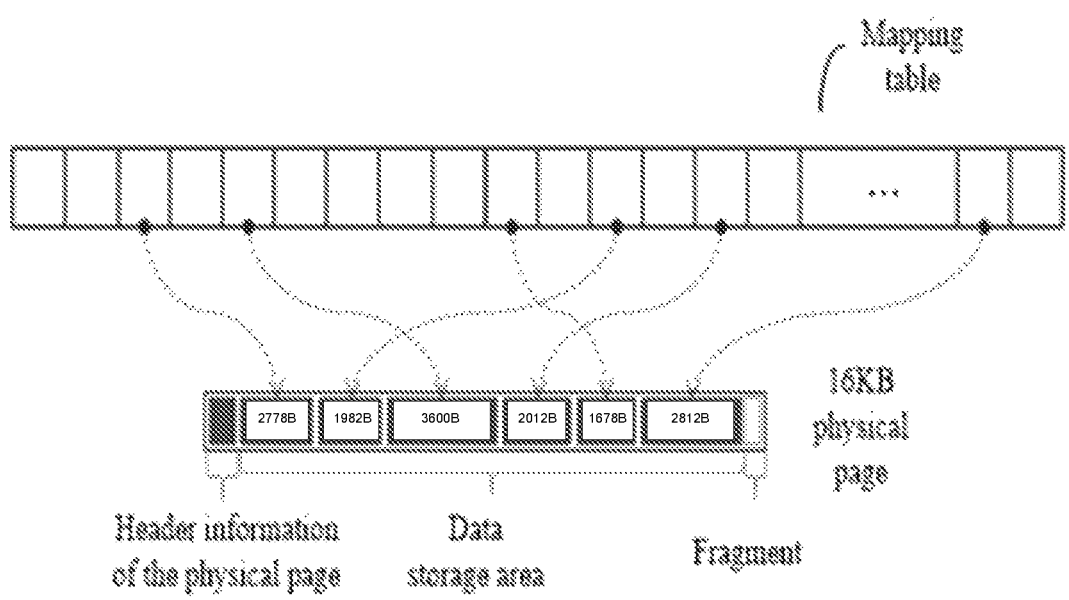
FIG. 10 is a diagram of an example of a manner of storing mapping information according to an embodiment of the present invention.

Referring to FIG. 10, assuming that a length of a physical page is 16 KB, compressed blocks of different sizes that are obtained by means of variable-length compression may be placed on the physical page in sequence until a next complete compressed block cannot be placed. Partial storage space that cannot be used may exist at the end of the physical page. The partial storage space is too small to contain a complete compressed block. The partial storage space that cannot be used may be referred to as a fragment (fragment), and the fragment may not store valid data.

Assuming that a basic granularity of a mapping table is 4 KB, and that a size of a physical page is 16 KB, a mapping relationship between a logical address and a physical address of a 4 KB data block may be recorded in the SSD by using any one of the following three solutions.

Solution 1: Mapping information in a mapping table includes information about a physical page storing a compressed block. A header of the physical page stores metadata, and the metadata indicates a start address of the compressed block on the physical page and a length of the compressed block. When the compressed block is to be read, the corresponding physical page may be first found according to the mapping information stored in the mapping table; then data on the physical page is read as a whole, and header information of the physical page is searched for the start address and the length of the compressed block on the physical page. In some embodiments, the header information of the physical page may store metadata of a plurality of compressed blocks. To help search for metadata of a compressed block, a correspondence between an LBA of the 4 KB data block and metadata may be established in the header information of the physical page. In this case, the SSD can search for, according to the LBA of the data block, the metadata corresponding to the compressed block.

Solution 2: Similar to Solution 1, in Solution 2, information about a physical page of a compressed block is stored in a mapping table, and metadata of the compressed block is stored on the physical page. A difference lies in that, the mapping table stores not only the information about the physical page of the compressed block but also index information. The index information may describe a position of the compressed block in a sequence of all compressed blocks stored on the physical page. In this way, when searching for the metadata of the physical page, the SSD does not need to locate the metadata of the compressed block by searching a complex LBA as does in Solution 1, but locate the metadata according to the index information, thereby reducing a data volume of the metadata and saving storage space of the physical page.

Solution 3: Mapping information in a mapping table includes information about a physical page storing a compressed block, a start address of the compressed block on the physical page, and a length of the compressed block. In this solution, metadata does not need to be stored on the physical page, so that an implementation manner of the physical page is simplified; in addition, a process of searching for metadata according to the mapping information is omitted, thereby improving addressing efficiency of a physical address.

Figure 11:
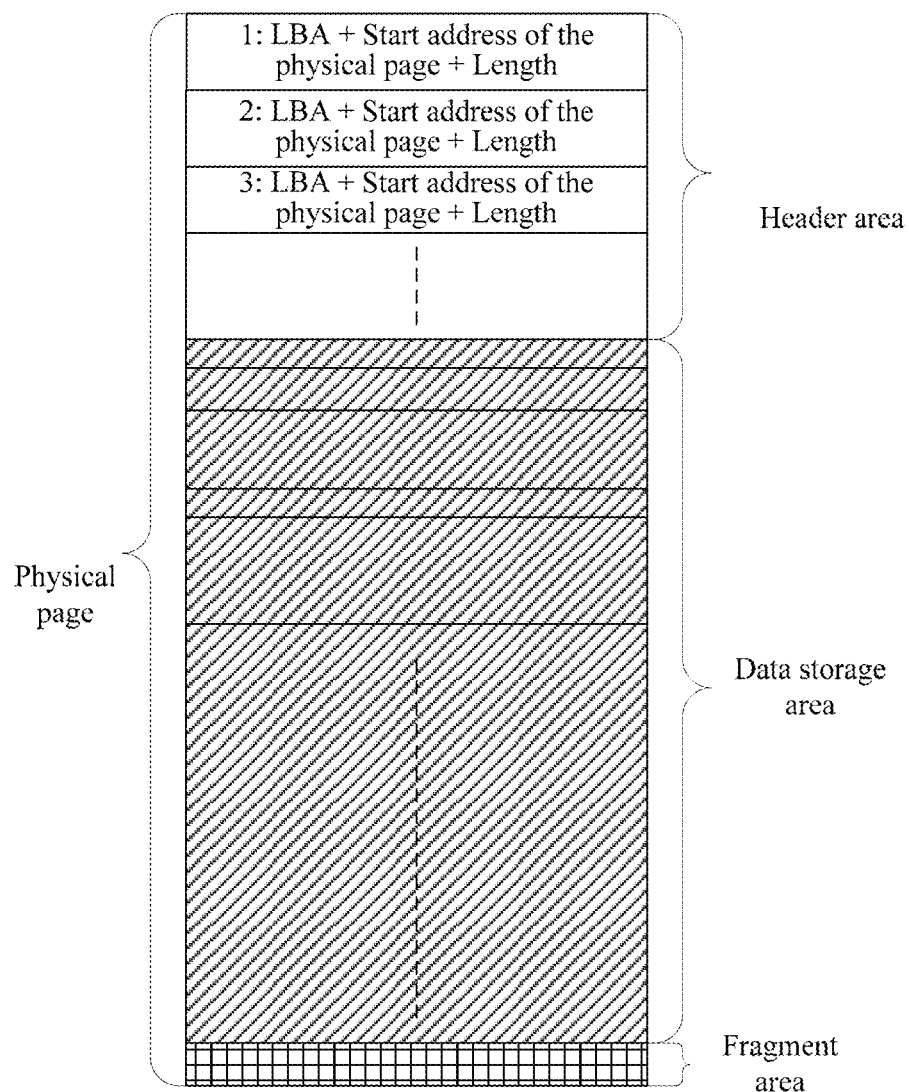
FIG. 11 is a structural diagram of an example of a physical page according to an embodiment of the present invention.

The following describes the foregoing solution 1 in detail with reference to FIG. 11. Referring to FIG. 11, a physical page is divided into three areas. A top area is a header area of the physical page, used for storing header information. A middle area is a data storage area, and stores a plurality of compressed blocks. A bottom area is a fragment area. The areas are separately described below.

1. Header Area

Header information is stored in the header area of the physical page. The header information includes metadata of a compressed block stored on the physical page. A format of the metadata may be: LBA+Start address of the physical page+Length of the compressed block. Certainly, if index information already exists in the mapping table, the format of the metadata may be: Index information+Start address of the physical page+Length of the compressed block. In addition, the mapping information may also be stored in the over-provisioning space of the SSD, so that storage space of the physical page can be saved.

2. Data Storage Area

The data storage area is used for storing compressed blocks. The compressed blocks may be compactly stored together on the physical page.

3. Fragment Area

The fragment area is an unused storage area, is too short to store a complete compressed block, and therefore can only be left over.

Figure 12:
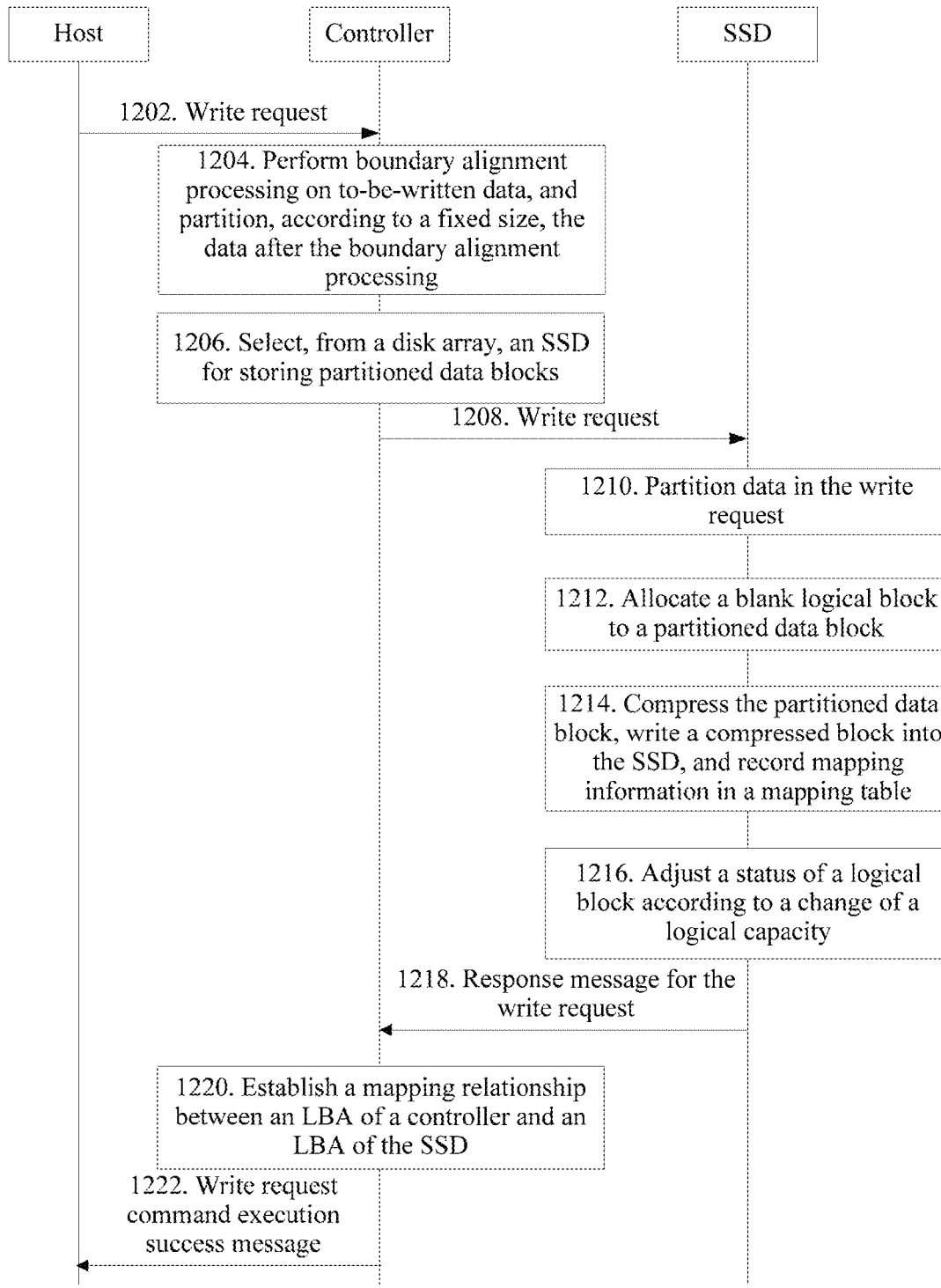
FIG. 12 is a flowchart of processing a write request according to an embodiment of the present invention.

The foregoing describes fixed-length compression and variable-length compression implementation manners. With reference to FIG. 12, the following describes in detail a write request processing procedure during implementation of data compression in an SSD.

FIG. 12 is a flowchart of processing a write request according to an embodiment of the present invention. It should be understood that, steps or operations shown in FIG. 12 are only examples. In this embodiment of the present invention, other operations or variations of various operations in FIG. 12 may also be performed. In addition, the steps in FIG. 12 may be performed according to a sequence different from that presented in FIG. 12, and possibly not all operations in FIG. 12 need to be performed.

1202. A host sends a write request to a controller.

In some embodiments, the write request may include the following information: LUN_ID+LBA+LEN+DATA. DATA indicates to-be-written data. LUN_ID indicates a number of a logical unit number (Logical Unit Number, LUN). Herein, LBA indicates a logical address of DATA on the LUN, instead of a logical address of an SSD. A logical address of the LUN generally refers to an LBA of a disk array presented to the host. LEN indicates a length of data, and DATA is the to-be-written data. It should be understood that, the LBA and the LEN defined in a system is generally on a per-sector basis, and a size of a sector is generally 0.5 KB. Assuming that the LEN is 10, it may be understood that the length of DATA is 10*0.5 KB=5 KB. Certainly, each sector may further have other sizes or formats. This is not In some embodiments limited in this embodiment of the present invention. Herein, a 0.5 KB sector size is used as an example for description.

1204. The controller performs boundary alignment processing on to-be-written data, and partitions, according to a fixed size, data obtained after the boundary alignment processing. This is an optional step.

The boundary alignment processing on the DATA by the controller is to facilitate subsequent data partitioning, so that the controller can obtain an integer quantity of partitioned data blocks when partitioning the data according to the fixed size.

The controller may partition the data in a plurality of manners. The following provides two optional partitioning manners.

Partitioning manner 1: The controller performs partitioning according to a compression granularity of the SSD, so that each partitioned data block is a compressible unit. For example, it is assumed that the compression granularity of the SSD is 4 KB, and that the LEN of the to-be-written data is 10 (that is, 5 KB). In this case, the controller may first perform boundary alignment processing on the 5 KB data to obtain 8 KB data, and then partition the 8 KB data at a granularity of 4 KB, to obtain two 4 KB data blocks. A manner of performing boundary processing on the 5 KB data by the controller may be: for example, the controller reads 3 KB data from the SSD, and rounds the data and the 5 KB data to obtain the 8 KB data.

Partitioning manner 2: The controller performs partitioning based on a maximum unit of written data that can be processed by the SSD at a time. For example, if a maximum unit of written data that can be processed by the SSD at a time is 128 KB, partitioning may be performed according to 128 KB herein. This processing manner simplifies operations of the controller. Subsequently, the SSD continues to partition the 128 KB data according to a compression granularity. For example, a processor of the SSD partitions the 128 KB data into thirty-two 4 KB data blocks.

It should be noted that, after the data is partitioned, the controller may send a write request to the SSD by using a partitioned data block as a unit. In this case, parameters such as LUN_ID+LBA+LEN+DATA of each partitioned data block may be determined based on parameters such as LUN_ID+LBA+LEN+DATA of complete data before the partitioning.

1206. The controller selects, from a disk array, an SSD for storing partitioned data blocks.

The controller may select an SSD according to a plurality of policies, for example, may select an appropriate SSD based on wear leveling between SSDs, fault tolerance processing, a redundancy relationship, and the like. It should be noted that existence of sufficient blank logical blocks in the SSD first needs to be ensured during SSD selection. A quantity of blank logical blocks in the SSD in the disk array dynamically changes as a logical capacity of the SSD changes. The controller may query the quantity of the blank logical blocks in the SSD according to the foregoing blank logical block query solution.

1208. The controller sends, to the SSD, a write request corresponding to each partitioned data block.

The write request may carry LEN+DATA information of the partitioned data block. LEN indicates a length of data in the write request, and DATA indicates data content (or referred to as data itself, that is, the data block) in the write request. It should be understood that, herein a location in the SSD to which the data in the write request needs to be written may not be specified, that is, the actual storage location of the data in the SSD may be determined by the SSD itself.

1210. The SSD performs partitioning processing on data in the write request.

It should be understood that, step 1210 is an optional step. If the controller partitions the data according to the compression granularity in step 1204, a size of the data in the write request received by the SSD is a basic compression unit, so that partitioning does not need to be performed again, and a subsequent operation may be performed directly. If the controller partitions the data according to N times of the compression granularity in step 1204, the size of the data received by the SSD is N times of the compression granularity, and the data may be partitioned into N data blocks according to the compression granularity in step 1210. In a special case, if a size of a data block received by the SSD is not an integer multiple of the compression unit, the SSD may first stuff the data block to an integer multiple of the compression unit, and then perform partitioning according to the size of the compression unit.

1212. The SSD allocates a blank logical block to a partitioned data block.

The SSD may query statuses of logical blocks in the SSD, and select a blank logical block for storing the data block. A blank logical block may be selected in a plurality of manners. For example, a blank logical block may be randomly selected from the SSD, or a blank logical block with a logical address at the front may be preferentially selected according to a sequence of blank logical blocks in a mapping table. This is not In some embodiments limited in this embodiment of the present invention.

A status of a logical block may be indicated by a bitmap. The bitmap may be stored in a memory of the SSD. After the data block is stored in the blank logical block, a state of the blank logical block may be changed, so that the blank logical block changes into a valid logical block.

1214. The SSD compresses the partitioned data block, writes a compressed block into the SSD, and records mapping information in a mapping table.

Manners of performing step 1214 by an SSD supporting fixed-length compression and an SSD supporting variable-length compression may be different, and are described separately below with reference to FIG. 13 and FIG. 14.

1216. The SSD adjusts a status of a logical block according to a change of a logical capacity.

In some embodiments, one isolated logical block is converted into a blank logical block every time the logical capacity increases by a size of one logical block. The isolated logical block may be an isolated logical block randomly selected from all isolated blocks in the SSD; or the isolated logical block may be an isolated logical block with a logical address at the front in all isolated blocks in the SSD. If no isolated logical block exists in the SSD, an entry corresponding to a blank logical block may be added at the end of the mapping table. This is equivalent to adding a blank logical block in the SSD.

After adjustment to the status of the logical block is completed, a quantity of current blank logical blocks in the SSD may be sent to the controller, to indicate a remaining logical capacity of the SSD. For example, it is assumed that the SSD currently has 1000 blank logical blocks (each blank logical block corresponds to 4 KB actual physical space, and there is 1000*4 KB actual available logical space in total). When the controller queries the quantity of the blank logical blocks included in the SSD, the SSD returns a query result to the controller: Currently there are 1000 blank logical blocks. Therefore, the controller may write one thousand 4 KB data blocks into the SSD. It is assumed that 500 of the 1000 data blocks written by the controller into the SSD can be compressed to 2 KB each, and that the other 500 data blocks can be compressed to 1 KB each. Originally, the 1000 blank logical blocks need to be consumed for storing the data blocks. Currently, only (500*2+500*1)/4=375 blank logical blocks are consumed due to compression. That is, only 375 blank logical blanks are consumed for storing the one thousand 4 KB data blocks. Then when the controller queries a quantity of available blank logical blocks again, the SSD returns a query result: Currently, 1000−375=625 blank logical blocks are available.

1218. The SSD sends a response message for the write request to the controller.

After the data block in the write request is written into the SSD, the SSD sends the response message to the controller. A logical address, for example, an LBA, of the data block in the SSD may be carried in the response message. A specific form of the response message is related to a partitioning manner described in step 1204.

If the controller partitions the data according to the compression granularity in step 1204, the SSD does not need to further partition the data, but may directly allocate a logical address to the data in the write request, and perform compression and storage operations on the data. The response message for the foregoing write request may be a normal write complete command, and needs to carry only one LBA corresponding to a data block.

If the controller partitions the data according to a larger granularity in step 1204, the response message in step 1218 needs to carry LBAs corresponding to a plurality of partitioned data blocks. In this case, a new write complete command may be defined. A data volume of the new write complete command needs to be greater than that of a normal write complete command. For example, if a normal write complete command is 16 bytes, a new defined write complete command may be 32/64/128 bytes, so as to contain more LBAs. It should be noted that, if a plurality of LBAs needs to be brought back with the write complete command, a sequence of the plurality of LBAs in the write complete command may keep consistent with a sequence of data blocks corresponding to the plurality of LBAs. In this way, no additional byte needs to be consumed for indicating LBAs of data that correspond to the plurality of LBAs respectively.

1220. The controller establishes a mapping relationship between an LBA of the disk array and an LBA of the SSD.

The controller receives the write request sent by the host in step 1202, and the write request carries the LUN_ID and the LBA of the disk array. The write complete command received by the controller in step 1218 includes the LBA of the SSD. The controller establishes the mapping relationship between the LBA of the disk array and the LBA of the SSD.

For example, the storage controller writes two 4 KB data blocks consecutively into a LUN device whose LUN_ID is 0, from a start position LBA=0 according to the write request received in step 1202. Because an LBA and a LEN defined in a system is generally on a per-sector basis, and a size of a sector is generally 0.5 KB, a LEN of a 4 KB data block is 8. In this way, a logical address of the first data block in the disk array may be indicated by (LUN_ID=0, LBA=0, LEN=8); and a logical address of the second data block in the disk array may be indicated by (LUN_ID=0, LBA=8, LEN=8). Assuming that the first data block is written into the second logical block in an SSD whose ID is 2, and the second data block is written into the third logical block in an SSD whose ID is 3, a logical address of the first data block in the SSD may be indicated by (SSD ID=2, LBA=8, LEN=8), and a logical address of the second data block in the SSD may be indicated by (SSD ID=3, LBA=16, LEN=8). In this case, the controller may establish a mapping relationship shown in the following table:

| LUN_ID, LBA, LEN | SSD (SSD_ID, LBA, LEN) |
|---|---|
| 0, 0, 8 | 2, 8, 8 |
| 0, 8, 8 | 3, 16, 8 |

The controller may record the mapping relationship between the LBA of the disk array and the LBA of the SSD to facilitate subsequent data reading. In some embodiments, when the host needs to read data that is previously written into the SSD, the controller converts a read request of the host into a read request for the SSD based on the recorded mapping relationship table, and returns corresponding data to the host. For example, the host needs to read the second piece of 4 KB data whose LUN_ID is 0, that is, the second row in the foregoing table. The controller finds, based on the mapping relationship shown in the foregoing table, a location of an LBA 16 of the data stored in the SSD whose ID is 3. Next, the controller may send a read request to the SSD whose ID is 3, read the data at the location of the LBA 16, and return the read data to the host.

1222. The controller sends a write request command execution success message to the host.

Figure 13:
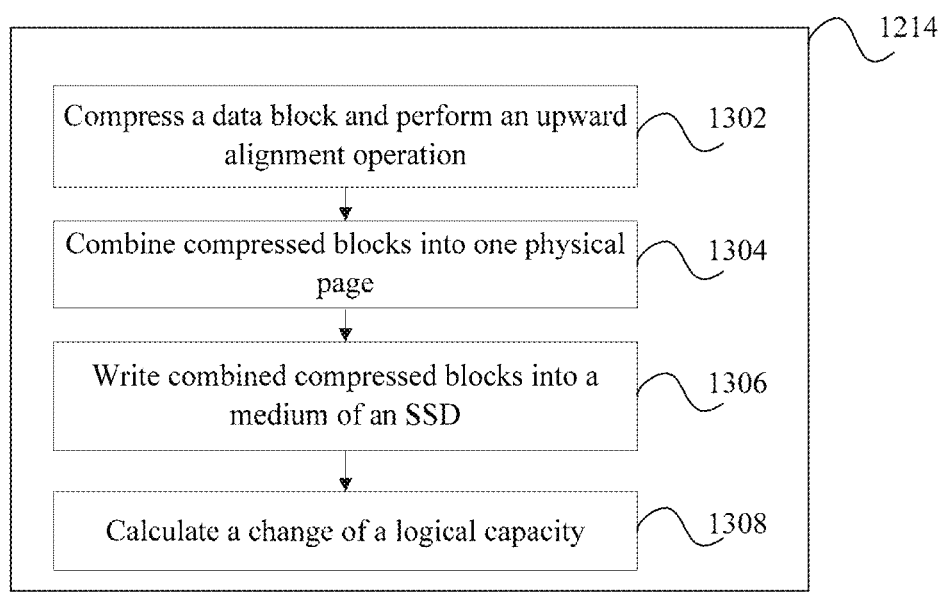
FIG. 13 is a schematic flowchart of an implementation manner of step 1214 in fixed-length compression.

FIG. 13 is a schematic flowchart of an implementation manner of step 1214 in fixed-length compression. It should be understood that, steps or operations shown in FIG. 13 are only examples. In this embodiment of the present invention, other operations or variations of various operations in FIG.

13 may also be performed. In addition, the steps in FIG. 13 may be performed according to a sequence different from that presented in FIG. 13, and possibly not all operations in FIG. 13 need to be performed.

1302. Compress a data block and perform an upward alignment operation.

For example, a compression granularity of a data block is 4 KB. Fixed-length compression requires data to be compressed to an integer multiple of 0.5 KB. After the data block is compressed, if compressed data is between 1.5 KB and 2 KB, an upward alignment operation is performed to obtain a 2 KB compressed block.

1304. Combine compressed blocks into one physical page.

The manner of rounding compressed blocks is described above in detail. Refer to FIG. 8 for details, which are not described herein again. Because of fixed-length compression, one physical page may be filled with a plurality of compressed blocks, and no fragment is generated.

1306. Write rounded compressed blocks into a medium of an SSD.

For example, after the compressed blocks are rounded into one full physical page, the compressed blocks are written into the medium of the SSD. After a write success, mapping information of the compressed blocks in a mapping table is updated, and a physical address corresponding to a logical address is recorded in the mapping table. It should be noted that, this embodiment of the present invention is not limited thereto, and all processed compressed blocks may also be written into the medium of the SSD at a time.

1308. Calculate a change of a logical capacity.

For example, a change of the logical capacity may be calculated every time one data block has been compressed; or a change of the logical capacity may be calculated after all data has been compressed. This is not In some embodiments limited in this embodiment of the present invention. A specific manner of calculating a change of a logical capacity is described above in detail, and is not described herein again.

Figure 14:
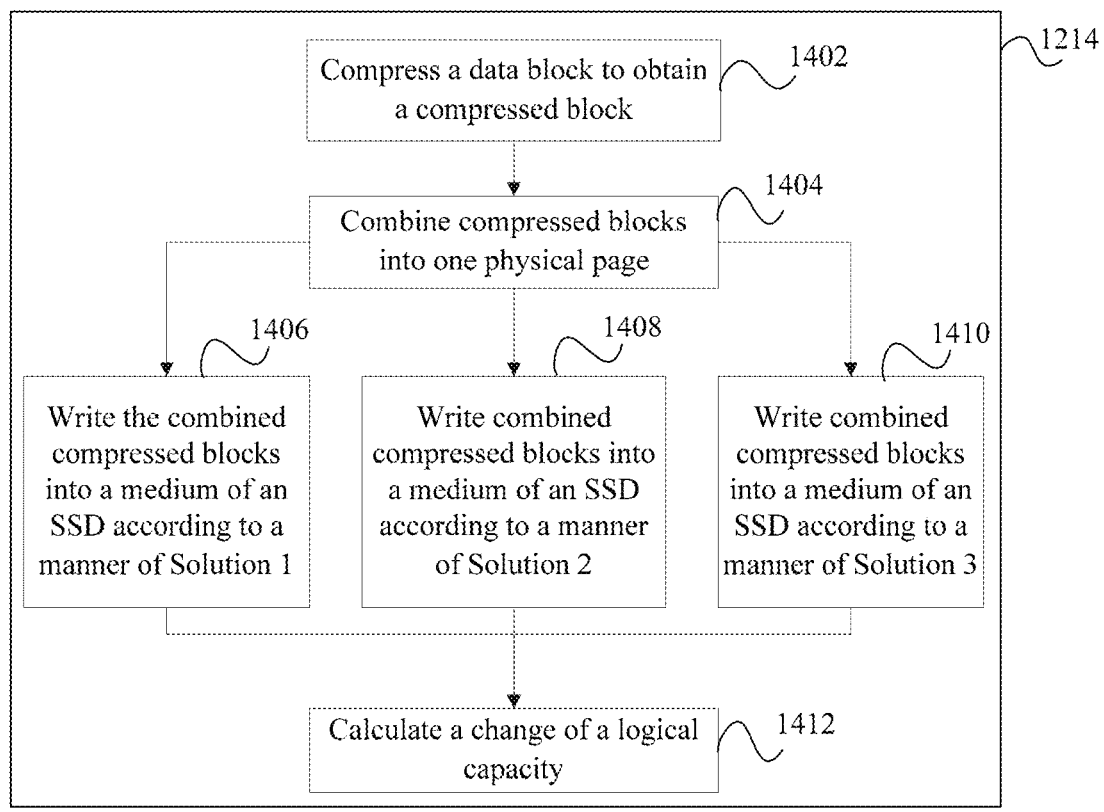
FIG. 14 is a schematic flowchart of an implementation manner of step 1214 in variable-length compression.

FIG. 14 is a schematic flowchart of an implementation manner of step 1214 in variable-length compression. It should be understood that, steps or operations shown in FIG. 14 are only examples. In this embodiment of the present invention, other operations or variations of various operations in FIG. 14 may also be performed. In addition, the steps in FIG. 14 may be performed according to a sequence different from that presented in FIG. 14, and possibly not all operations in FIG. 14 need to be performed.

1402. Compress a data block to obtain a compressed block.

Because of variable-length compression, an upward alignment operation does not need to be performed on data herein, and a size of the compressed block is kept the same.

1404. Combine compressed blocks into one physical page.

For example, variable-length compressed blocks may be rounded end to end into one physical page. A final remaining area that cannot further contain a complete compressed block may serve as a fragment, and does not store valid data.

1406. Write rounded compressed blocks into a medium of an SSD in a manner of Solution 1.

Solution 1: Mapping information in a mapping table includes information about a physical page storing a compressed block. A header of the physical page stores metadata, and the metadata indicates a start address of the compressed block on the physical page and a length of the compressed block. When the compressed block is to be read, the corresponding physical page may be first found according to the mapping information stored in the mapping table; then data on the physical page is read as a whole, and header information of the physical page is searched for the start address and the length of the compressed block on the physical page. In some embodiments, the header information of the physical page may store metadata of a plurality of compressed blocks. To help search for metadata of a compressed block, a correspondence between an LBA of the 4 KB data block and metadata may be established in the header information of the physical page. In this case, the SSD can search for, according to the LBA of the data block, the metadata corresponding to the compressed block.

1408. Write rounded compressed blocks into a medium of an SSD in a manner of Solution 2.

Solution 2: Similar to Solution 1, in Solution 2, information about a physical page of a compressed block is stored in a mapping table, and metadata of the compressed block is stored on the physical page. A difference lies in that, the mapping table stores not only the information about the physical page of the compressed block but also index information, where the index information may describe a position of the compressed block in a sequence of all compressed blocks stored on the physical page. In this way, when searching for the metadata of the physical page, the SSD does not need to locate the metadata of the compressed block by searching a complex LBA as does in Solution 1, but locate the metadata according to the index information, thereby reducing a data volume of the metadata and saving storage space of the physical page.

1410. Write rounded compressed blocks into a medium of an SSD in a manner of Solution 3.

Solution 3: Mapping information in a mapping table includes information about a physical page storing a compressed block, a start address of the compressed block on the physical page, and a length of the compressed block. In this solution, metadata does not need to be stored on the physical page, so that an implementation manner of the physical page is simplified; in addition, a process of searching for metadata according to the mapping information is omitted, thereby improving addressing efficiency of a physical address.

It should be understood that, in practice, only one of step 1406 to step 1410 needs to be performed.

1412. Calculate a change of a logical capacity.

For example, a change of the logical capacity may be calculated every time one data block has been compressed; or a change of the logical capacity may be calculated after all data has been compressed. This is not In some embodiments limited in this embodiment of the present invention. A specific manner of calculating a change of a logical capacity is described above in detail, and is not described herein again.

Figure 5:
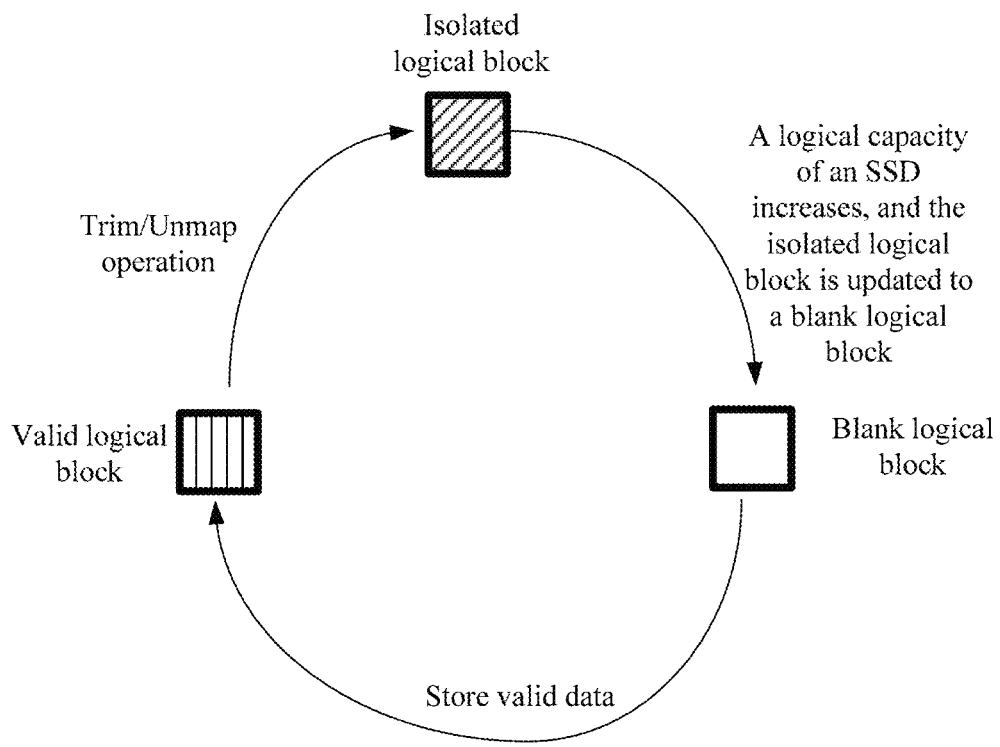
FIG. 5 is a diagram of state transition of a logical block according to an embodiment of the present invention.

The foregoing describes transitions of a logical block between three states in detail with reference to FIG. 5, where an isolated logical block is generated by triggering a trim/unmap command. The following describes in detail trim/unmap-related processing procedures with reference to FIG. 15.

Figure 15:
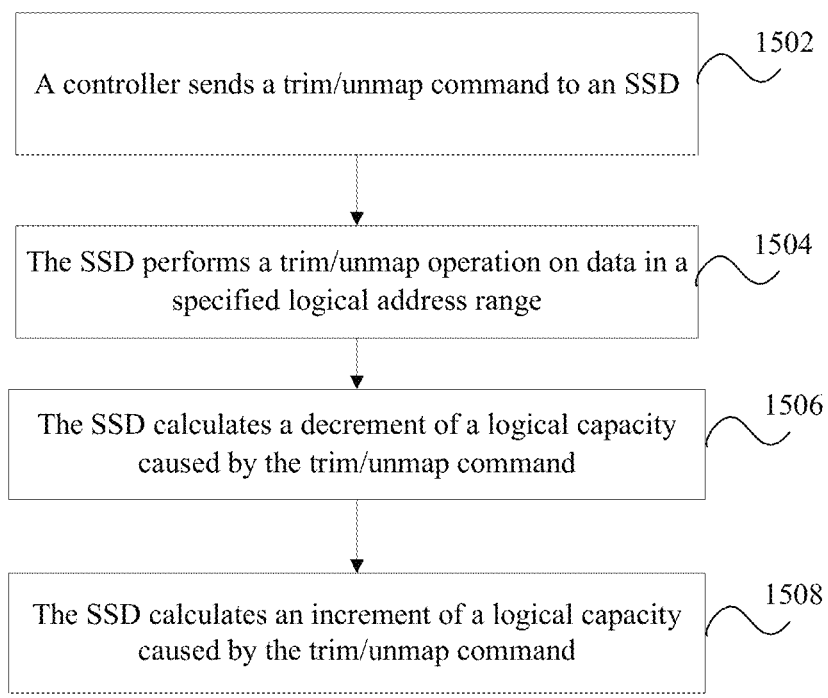
FIG. 15 is a diagram of an example of a trim/unmap procedure according to an embodiment of the present invention.

FIG. 15 is a diagram of an example of a trim/unmap procedure according to an embodiment of the present invention. It should be understood that, steps or operations shown in FIG. 15 are only examples. In this embodiment of the present invention, other operations or variations of various operations in FIG. 15 may also be performed. In addition, the steps in FIG. 15 may be performed according to a sequence different from that presented in FIG. 15, and possibly not all operations in FIG. 15 need to be performed.

For ease of understanding, a process of a trim/unmap operation is first described briefly.

Generally, when a host needs to delete some data from a disk, a controller sends a trim/unmap command to an SSD, and first marks the data as invalid data. Because of features of the SSD, a physical block occupied by the invalid data temporarily cannot be written with new data (that is, cannot be overwritten), and can continue to store new data only after the physical block in which the invalid data is located is erased by using a garbage collection mechanism.

When the controller trims or unmaps a logical address range, a logical block corresponding to the logical address range may change from a valid logical block to an isolated logical block. A logical address range in a trim/unmap command may be selected according to a multiple of a logical block, so as to facilitate the trim/unmap operation of the SSD.

Trim/Unmap is accompanied with a decrement of a logical capacity of the SSD and an increment of an available logical capacity of the SSD. In some embodiments, the logical address range at which the trim/unmap command is directed may be marked as invalid, and in this case, a capacity corresponding to the logical address range needs to be removed from the logical capacity of the SSD. In addition, physical space corresponding to the logical address range cannot be utilized immediately, because the trim/unmap operation only marks data in the physical space as invalid, and the physical space needs to be released by using the garbage collection mechanism. However, because over-provisioning space exists, an increase of a logical capacity corresponding to the physical space can be reflected immediately. Details are described below with reference to steps in FIG. 15.

1502. A controller sends a trim/unmap command to an SSD.

Generally, the controller first receives a trim/unmap command sent by a host, where the command instructs to mark a segment of data as invalid data. The controller finds a logical address range of the segment of data in the SSD, then sends the trim/unmap command to the SSD, and instructs the SSD to mark data in the logical address range as invalid data or cancel a mapping relationship between a logical address and a physical address of the data in the address range. The trim/unmap command sent by the controller to the SSD may carry a logical address of data to be trimmed or unmapped, for example, LBA+LEN of the data to be trimmed or unmapped in the SSD.

1504. The SSD performs a trim/unmap operation on data in a specified logical address range.

In some embodiments, the SSD may select a logical block in the logical address range, then extract mapping information from an entry that is in a mapping table and corresponds to the logical block, find a physical address of the logical block in the physical block, and then mark data in the physical address as invalid.

Two statistical values may be maintained in the physical block, where one value may indicate a total quantity of data blocks stored in the physical block, and the other value may indicate a quantity of valid data blocks stored in the physical block. The SSD may determine, according to the quantity of the valid data blocks in the physical block or a percentage of the valid data blocks, whether to perform garbage collection. When data is written into the physical block, the quantity of the valid data blocks corresponding to the physical block increases. Every time one valid data block in the physical block is trimmed or unmapped, the quantity of the valid data blocks in the physical block decreases by 1. The trim/unmap operation is performed cyclically in the foregoing manner until all logical blocks in the logical address range are processed.

1506. The SSD calculates a decrement of a logical capacity caused by the trim/unmap command.

After mapping relationships of all logical blocks in an address range corresponding to the trim/unmap command are canceled, the logical capacity of the SSD may be calculated and adjusted. For a specific computation manner, refer to the following formula:

Decrement of the logical capacity=Logical capacity of a logical address in the trim/unmap operation range

1508. The SSD calculates an increment of an available logical capacity caused by the trim/unmap command.

In some embodiments, it is assumed that invalid data occupies 80 KB physical space of the SSD. Although the 80 KB physical space can be released only after garbage collection, 80 KB over-provisioning space may be first borrowed from the over-provisioning space of the SSD, and subsequently after the 80 KB physical space occupied by the invalid data is released by using the garbage collection mechanism, data in the 80 KB over-provisioning space is moved to storage space corresponding to a physical capacity.

By using this mechanism, once the trim/unmap operation generates invalid data, over-provisioning space may be borrowed to "release" the physical space occupied by the invalid data. In this case, the available logical capacity of the SSD may increase by 80 KB accordingly. If a size of a logical block is 8 KB, 10 isolated logical blocks may be converted into blank logical blocks. This is equivalent to addition of 10 available blank logical blocks. The blank logical blocks that are released can be used to store new written data.

For example, assuming that a logical address range indicated by the trim/unmap command received by the SSD is 100 K, due to compressed storage, physical space actually occupied by data in the 100 K logical address range is 80 K. In this case, 80 K over-provisioning space may be borrowed from the over-provisioning space. The 80 K over-provisioning space can be used to store new data. In this example, a decrement of the logical capacity of the SSD caused by the trim/unmap command is 100 K. By using the over-provisioning space, an increment of the available logical capacity of the SSD is 80 K.

The foregoing describes in detail a write request processing procedure with reference to FIG. 10. A read request (or referred to as a read IO) processing procedure is an inverse process of the write request processing procedure. The following describes a read request processing procedure according to an embodiment of the present invention in detail with reference to FIG. 16.

Figure 16:
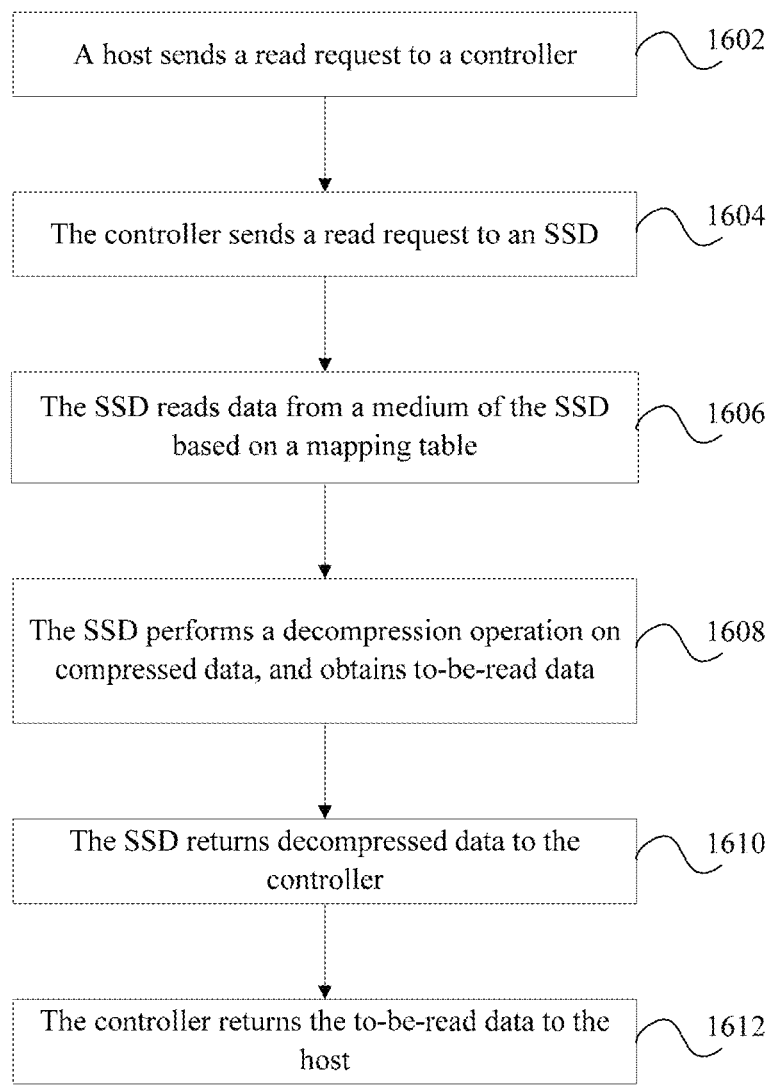
FIG. 16 is a schematic flowchart of processing a read request according to an embodiment of the present invention.

FIG. 16 is a schematic flowchart of processing a read request according to an embodiment of the present invention. It should be understood that, steps or operations shown in FIG. 16 are only examples. In this embodiment of the present invention, other operations or variations of various operations in FIG. 16 may also be performed. In addition, the steps in FIG. 16 may be performed according to a sequence different from that presented in FIG. 16, and possibly not all operations in FIG. 16 need to be performed.

1602. A host sends a read request to a controller.

The read request sent by the host may include a LUN_ID, an LBA of to-be-read data in a disk array, and a length of the to-be-read data.

1604. The controller sends the read request to an SSD.

In some embodiments, the controller may query, according to the LUN_ID, the LBA of the to-be-read data in the disk array, and the length of the to-be-read data that are received in step 1602, a mapping table maintained by the controller itself (the mapping table may be used to indicate a mapping relationship between an LBA of the disk array presented to the host and an LBA of the SSD), and determine an SSD in which the to-be-read data is located, and an LBA and a length of the to-be-read data in the SSD.

1606. The SSD reads compressed data from a medium of the SSD based on a mapping table.

Assuming that the SSD uses a fixed-length compression manner, and the mapping table stores information about a physical page storing the compressed data, a start address of the compressed data on the physical page, and a length of the compressed data, the SSD may directly locate the compressed data according to the information stored in the mapping table.

Assuming that the SSD uses a variable-length compression manner, the mapping table stores only information about a physical page storing compressed data, and a start address and a length of the compressed data on the physical page are located in a header of the physical page, the SSD may first find the physical page according to the information about the physical page, find the start address and the length of the compressed data on the physical page from header information of the physical page, and then locate the compressed data according to the start address and the length of the compressed data on the physical page.

1608. The SSD performs a decompression operation on the compressed data to obtain to-be-read data.

The SSD may decompress the compressed data by using an internal decompression unit, and restore the to-be-read data.

1610. The SSD returns the to-be-read data to the controller.

1612. The controller returns the to-be-read data to the host.

The foregoing describes in detail a data processing method according to an embodiment of the present invention with reference to FIG. 1 to FIG. 16. The following describes an SSD according to an embodiment of the present invention in detail with reference to FIG. 17 and FIG. 18. It should be understood that, the SSD in FIG. 17 or FIG. 18 can implement each step performed by the SSD in FIG. 1 to FIG. 16. To avoid repetition, details are not described herein again.

The following describes an apparatus embodiment and a system embodiment of the present invention. Because the apparatus embodiment and the system embodiment can be used to execute the foregoing method, for parts that are not described in detail, refer to the foregoing method embodiments.

Figure 17:
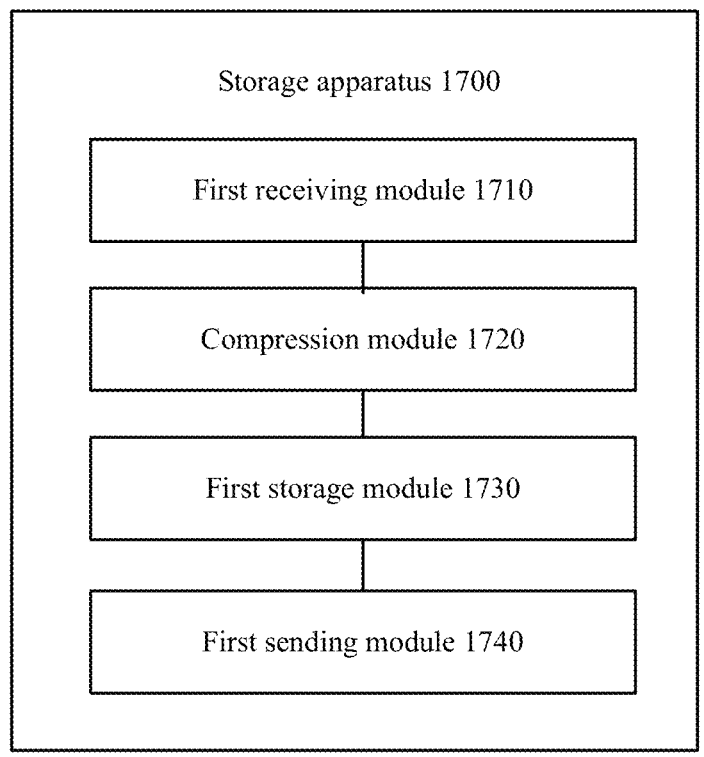
FIG. 17 is a schematic structural diagram of a storage apparatus according to an embodiment of the present invention.

FIG. 17 is a schematic structural diagram of a storage apparatus according to an embodiment of the present invention. It should be understood that, a function or logic of the storage apparatus 1700 may be implemented by using software only, or may be implemented by using hardware only, or may be implemented by using a combination of software and hardware. For example, the storage apparatus 1700 may be implemented by using a combination of software and hardware; in this case, a receiving module in the following description may be implemented by using a receiver circuit, and a compression module in the following description may be implemented by using computer code. For another example, the storage apparatus 1700 may be implemented by using hardware only, and a function or logic of each module in the following description may be implemented by using a logic circuit. For another example, the storage apparatus 1700 may be implemented by using hardware only, and each module in the following description may be a functional module corresponding to computer code.

The storage apparatus 1700 includes:

a first receiving module 1710, configured to receive a write request from a controller, where the write request carries to-be-written data;

a compression module 1720, configured to compress the to-be-written data to obtain compressed data;

a first storage module 1730, configured to store the compressed data; and a first sending module 1740, configured to send first feedback information to the controller, where the first feedback information indicates a remaining capacity of the storage apparatus 1700 after the compressed data is stored.

Optionally, in some embodiments, the storage apparatus 1700 further includes: a second sending module, configured to send second feedback information to the controller, where the second feedback information indicates a logical capacity of the storage apparatus 1700, and the logical capacity of the storage apparatus 1700 is the sum of an uncompressed data volume of stored data in the storage apparatus 1700 and a capacity of free physical space of the storage apparatus 1700.

Optionally, in some embodiments, the storage apparatus 1700 further includes: an allocation module, configured to allocate a blank logical block to the to-be-written data, where each logical block corresponds to a segment of logical capacity of the storage apparatus 1700; a first conversion module, configured to convert the blank logical block into a valid logical block, where the valid logical block is a logical block whose logical address is occupied by valid data; and a first query module, configured to query a quantity of remaining blank logical blocks in the storage apparatus 1700; where the first sending module 1740 in some embodiments is further configured to send the first feedback information to the controller, where the first feedback information includes the quantity of the remaining blank logical blocks and/or the remaining capacity, and the remaining capacity is determined based on the quantity of the remaining blank logical blocks.

In some embodiments, in some embodiments, the compression module 1720 in some embodiments is further configured to: after the allocation module allocates the blank logical block to the to-be-written data, compress the to-be-written data to obtain the compressed data; and the storage apparatus 1700 further includes: a first determining module, configured to determine, according to a size of the to-be-written data and a size of the compressed data, a quantity of blank logical blocks that need to be added in the storage apparatus 1700.

In some embodiments, in some embodiments, the storage apparatus 1700 further includes: an adding module, configured to add, according to the quantity of the blank logical blocks that need to be added in the storage apparatus 1700, entries corresponding to new blank logical blocks to the mapping table.

In some embodiments, in some embodiments, the storage apparatus 1700 further includes: an updating module, configured to update an isolated logical block in the storage apparatus 1700 to a blank logical block according to the quantity of the blank logical blocks that need to be added in the storage apparatus 1700, where the isolated logical block is a logical block whose logical address cannot be used in the storage apparatus 1700.

In some embodiments, in some embodiments, the quantity M of blank logical blocks that need to be added in the storage apparatus 1700 is equal to a rounded-down result of dividing D by L, where D indicates a difference between a length of the to-be-written data and a length of the compressed data, and L indicates a length of a logical block in the storage apparatus 1700.

In some embodiments, in some embodiments, the storage apparatus 1700 further includes: a second receiving module, configured to receive a command from the controller, where the command includes a logical address range, and the command instructs to mark valid data in the logical address range as invalid data; and a second conversion module, configured to convert a valid logical block in the logical address range into an isolated logical block, where the isolated logical block is a logical block whose logical address cannot be used.

In some embodiments, in some embodiments, the storage apparatus 1700 further includes: a second determining module, configured to determine a size of physical space occupied by data in the logical address range; a selection module, configured to select partial over-provisioning space from over-provisioning space, where a size of the partial over-provisioning space is equal to the size of the physical space occupied by the data in the logical address range; and a third determining module, configured to use the partial over-provisioning space as the free physical space of the storage apparatus 1700.

In some embodiments, in some embodiments, the storage apparatus 1700 further includes: a second query module, configured to query the free physical space of the storage apparatus 1700 before the first feedback information is sent to the controller; and a fourth determining module, configured to determine the capacity of the free physical space as the remaining capacity.

In some embodiments, in some embodiments, the storage apparatus 1700 further includes: a fifth determining module, configured to allocate a logical address to the to-be-written data after the write request is received from the controller; and a first recording module, configured to record mapping information in an entry in the mapping table, the entry corresponding to the logical address, where the mapping information includes information about a physical page storing the compressed data, a start position of the compressed data on the physical page, and the length of the compressed data.

In some embodiments, in some embodiments, the storage apparatus 1700 further includes: a sixth determining module, configured to allocate a logical address to the to-be-written data after the write request is received from the controller; a second recording module, configured to record mapping information in an entry in the mapping table, the entry corresponding to the logical address, where the mapping information includes information about a physical page storing the compressed data; and a second storage module, configured to store metadata of the compressed data on the physical page, where the metadata includes a start position of the compressed data on the physical page and the length of the compressed data.

In some embodiments, in some embodiments, the write request includes the data length of the to-be-written data, and the logical address of the to-be-written data is allocated based on the data length.

In some embodiments, in some embodiments, the storage apparatus 1700 further includes: a third sending module, configured to send the logical address of the to-be-written data in the storage apparatus 1700 to the controller after the write request is received from the controller.

In some embodiments, in some embodiments, the storage apparatus 1700 further includes: a third receiving module, configured to: receive a read request from the controller, where the read request includes a logical address of to-be-read data; a reading module, configured to read target data in a physical address corresponding to the logical address of the to-be-read data; a decompression module, configured to decompress the target data to obtain the to-be-read data; and a fourth sending module, configured to send the to-be-read data to the controller.

It should be noted that, the storage apparatus 1700 may be, for example, an SSD. The storage apparatus 1700 may be implemented by an SSD including a communications interface, a storage medium, and a processor. The processor may perform, by running a computer instruction in a memory, operations described in the method embodiments.

The processor may further perform, by using a logical connection of internal hardware, operations described in the method embodiments, for example, implement the operations by using an application-specific integrated circuit (application-specific integrated circuit, ASIC for short), or by using a programmable logic device (programmable logic device, PLD for short). The PLD may be a complex programmable logic device (English: complex programmable logic device, CPLD for short), an FPGA, generic array logic (English: generic array logic, GAL for short), or any combination thereof. In this embodiment of the present invention, for example, the storage apparatus is an SSD. The SSD includes a storage medium and a processor. The storage medium is configured to provide storage space. The processor of the SSD includes: a first receiver circuit, configured to receive a write request from a controller, where the write request carries to-be-written data; a compression circuit, configured to compress the to-be-written data to obtain compressed data; a first storage circuit, configured to store the compressed data; and a first sending circuit, configured to send first feedback information to the controller, where the first feedback information indicates a remaining capacity of the SSD after the compressed data is stored.

Figure 18:
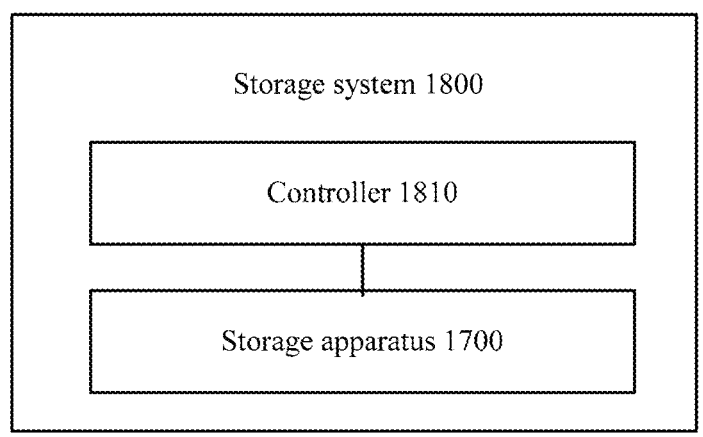
FIG. 18 is a schematic structural diagram of a storage system according to an embodiment of the present invention.

FIG. 18 is a schematic structural diagram of a storage system according to an embodiment of the present invention. The storage system 1800 in FIG. 18 includes a controller 1810 and the storage apparatus 1700 described in FIG. 17.

The controller 1810 is configured to: generate a write request including the to-be-written data; receive a response message for the write request from the storage apparatus 1700, where the response message includes a logical address of the to-be-written data in the storage apparatus 1700; and record a mapping relationship between a logical address of the to-be-written data in a disk array and the logical address of the to-be-written data in the storage apparatus 1700.

In some embodiments, in an embodiment, the controller 1810 is further configured to: receive new to-be-written data from a host; determine a remaining capacity of the storage apparatus 1700 according to the first feedback information; and when the remaining capacity of the storage apparatus 1700 is greater than a size of the new to-be-written data, write the new to-be-written data into the storage apparatus 1700.

Figure 19:
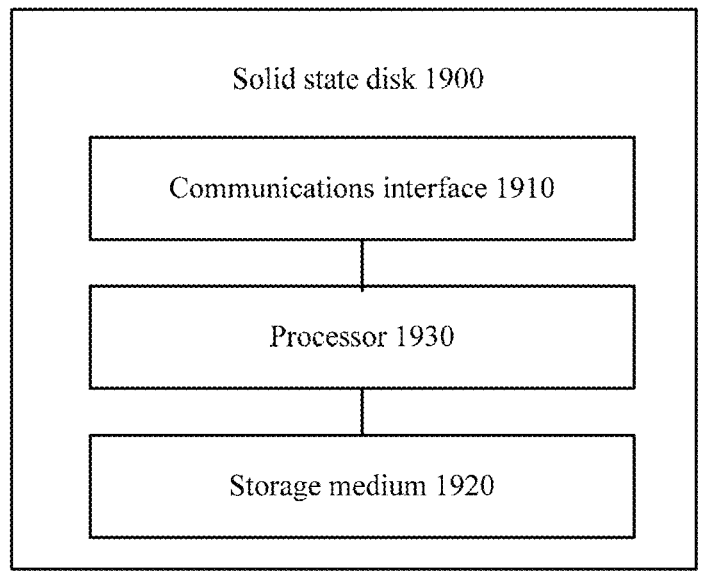
FIG. 19 is a schematic structural diagram of a solid state disk according to an embodiment of the present invention.

FIG. 19 is a schematic structural diagram of a solid state disk according to an embodiment of the present invention. The solid state disk 1900 in FIG. 19 includes:

a communications interface 1910, configured to communicate with a controller;

a storage medium 1920, configured to provide storage space; and a processor 1930, connected to the communications interface 1910 and the storage medium 1920, and configured to: receive a write request from the controller through the communications interface 1910, where the write request carries to-be-written data; compress the to-be-written data to obtain compressed data; store the compressed data in the storage medium 1920; and send first feedback information to the controller through the communications interface 1910, where the first feedback information indicates a remaining capacity of the storage medium 1920 after the compressed data is stored.

In some embodiments, in some embodiments, the processor 1930 is further configured to send second feedback information to the controller through the communications interface 1910, where the second feedback information indicates a logical capacity of the storage medium 1920, and the logical capacity of the storage medium 1920 is the sum of an uncompressed data volume of stored data in the storage medium 1920 and a capacity of free physical space of the storage medium 1920.

In some embodiments, in some embodiments, the processor 1930 is further configured to: allocate a blank logical block to the to-be-written data, where the blank logical block is a logical block with a free logical address, and each logical block corresponds to a segment of logical capacity of the storage medium 1920; convert the allocated blank logical block into a valid logical block, where the valid logical block is a logical block whose logical address is occupied by valid data; and query a quantity of remaining blank logical blocks in the solid state disk 1900; and the processor 1930 in some embodiments is further configured to send the first feedback information to the controller through the communications interface 1910, where the first feedback information includes the quantity of the remaining blank logical blocks and/or the remaining capacity, and the remaining capacity is determined based on the quantity of the remaining blank logical blocks.

In some embodiments, in some embodiments, the processor 1930 in some embodiments is further configured to: after the processor 1930 allocates the blank logical block to the to-be-written data, compress the to-be-written data to obtain the compressed data; and the processor 1930 is further configured to determine, according to a size of the to-be-written data and a size of the compressed data, a quantity of blank logical blocks that need to be added in the solid state disk 1900.

In some embodiments, in some embodiments, the processor 1930 is further configured to add, according to the quantity of the blank logical blocks that need to be added in the solid state disk 1900, entries corresponding to new blank logical blocks to a mapping table of the solid state disk 1900.

In some embodiments, in some embodiments, the processor 1930 is further configured to update an isolated logical block in the solid state disk 1900 to a blank logical block according to the quantity of the blank logical blocks that need to be added in the solid state disk 1900, where the isolated logical block is a logical block whose logical address cannot be used in the solid state disk 1900.

In some embodiments, in some embodiments, the quantity M of blank logical blocks that need to be added in the solid state disk 1900 is equal to a rounded-down result of dividing D by L, where D indicates a difference between a length of the to-be-written data and a length of the compressed data, and L indicates a length of a logical block in the solid state disk 1900.

In some embodiments, in some embodiments, the processor 1930 is further configured to: receive a command from the controller through the communications interface 1910, where the command includes a logical address range, and the command instructs to mark valid data in the logical address range as invalid data; and convert a valid logical block in the logical address range into an isolated logical block, where the isolated logical block is a logical block whose logical address cannot be used.

In some embodiments, in some embodiments, the processor 1930 is further configured to: determine a size of physical space occupied by data in the logical address range; select partial over-provisioning space from over-provisioning space, where a size of the partial over-provisioning space is equal to the size of the physical space occupied by the data in the logical address range; and use the partial over-provisioning space as the free physical space of the storage medium 1920.

In some embodiments, in some embodiments, before the processor 1930 sends the first feedback information to the controller through the communications interface 1910, the processor 1930 is further configured to: query the free physical space of the storage medium 1920; and determine the capacity of the free physical space as the remaining capacity.

In some embodiments, in some embodiments, after the processor 1930 receives the write request from the controller through the communications interface 1910, the processor 1930 is further configured to: allocate a logical address to the to-be-written data; and record mapping information in an entry in the mapping table, the entry corresponding to the logical address, where the mapping information includes information about a physical page storing the compressed data, a start position of the compressed data on the physical page, and the length of the compressed data.

In some embodiments, in some embodiments, after the processor 1930 receives the write request from the controller through the communications interface 1910, the processor 1930 is further configured to: allocate a logical address to the to-be-written data; record mapping information in an entry in the mapping table, the entry corresponding to the logical address, where the mapping information includes information about a physical page storing the compressed data; and store metadata of the compressed data on the physical page, where the metadata includes a start position of the compressed data on the physical page and the length of the compressed data.

In some embodiments, in some embodiments, the write request includes the data length of the to-be-written data, and the logical address of the to-be-written data is allocated based on the data length.

In some embodiments, in some embodiments, after the processor 1930 stores the compressed data, the processor 1930 is further configured to send the logical address of the to-be-written data in the storage medium 1920 to the controller through the communications interface 1910.

In some embodiments, in some embodiments, the processor 1930 is further configured to: receive a read request from the controller through the communications interface 1910, where the read request includes a logical address of to-be-read data; read target data in a physical address corresponding to the logical address of the to-be-read data; decompress the target data to obtain the to-be-read data; and send the to-be-read data to the controller through the communications interface 1910.

Figure 20:
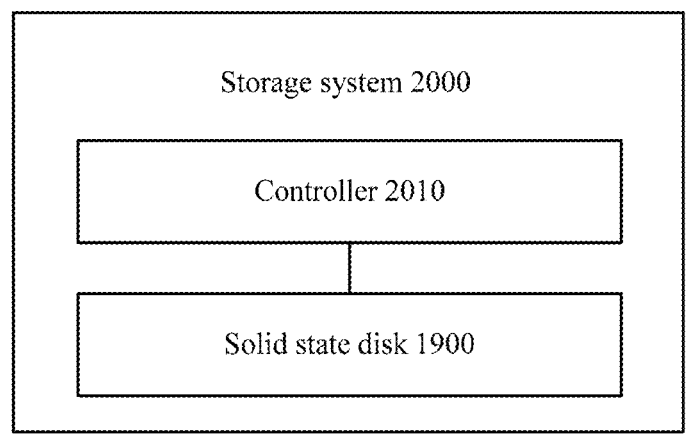
FIG. 20 is a schematic structural diagram of a storage system according to an embodiment of the present invention.

FIG. 20 is a schematic structural diagram of a storage system according to an embodiment of the present invention. The storage system 2000 in FIG. 20 includes a controller 2010 and the solid state disk 1900 in FIG. 19.

The controller 2010 is configured to: generate a write request including the to-be-written data; receive a response message for the write request from the processor 1930 through the communications interface 1910, where the response message includes a logical address of the to-be-written data in the storage medium 1920; and record a mapping relationship between a logical address of the to-be-written data in a disk array and the logical address of the to-be-written data in the storage medium 1920.

In some embodiments, in some embodiments, the controller 2010 is further configured to: receive new to-be-written data from a host; determine a remaining capacity of the solid state disk 1900 according to the first feedback information; and when the remaining capacity of the solid state disk 1900 is greater than a size of the new to-be-written data, write the new to-be-written data into the solid state disk 1900.

The term "and/or" in this specification represents that three relationships may exist. For example, A and/or B may represent the following three cases: Only A exists, both A and B exist, and only B exists. In addition, the character "/" in this specification generally indicates an "or" relationship between the associated objects.

A person of ordinary skill in the art may be aware that, the units and algorithm steps in the examples described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be rounded or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention.

What is claimed is:

1. A data processing method, applied to a solid state disk (SSD) and comprising:

receiving, by the SSD, a write request from a controller, wherein the write request carries to-be-written data;

allocating, by the SSD, a blank logical block to the to-be-written data, wherein the blank logical block is a logical block with a free logical address, the logical block corresponding to a segment of logical capacity of the SSD;

compressing, by the SSD, the to-be-written data to obtain compressed data;

storing, by the SSD, the compressed data;

sending, by the SSD, first feedback information to the controller, wherein the first feedback information indicates a remaining logical capacity of the SSD after the compressed data is stored, wherein the remaining logical capacity of the SSD corresponds to an actual amount of free data blocks on the SSD available for storing data;

converting, by the SSD, the allocated blank logical block into a valid logical block, wherein the valid logical block is a logical block whose logical address is occupied by valid data;

determining, by the SSD, according to a size of the to-be-written data and a size of the compressed data, a quantity of blank logical blocks that need to be added in the SSD, wherein a quantity M of blank logical blocks to be added in the SSD is equal to a rounded-down result of dividing D by L, wherein D indicates a difference between a length of the to-be-written data and a length of the compressed data, and L indicates a length of a logical block in the SSD;

querying, by the SSD, a quantity of remaining blank logical blocks in the SSD, and sending, by the SSD, second feedback information to the controller, wherein the second feedback information indicates the quantity of remaining blank logical blocks and/or remaining capacity of the SSD, wherein the remaining capacity is based on the quantity of the remaining blank logical blocks.

2. A data processing method, applied to a solid state disk (SSD) and comprising:
  receiving, by the SSD, a write request from a controller, wherein the write request carries to-be-written data;
  allocating, by the SSD, a blank logical block to the to-be-written data, wherein the blank logical block is a logical block with a free logical address, the logical block corresponding to a segment of logical capacity of the SSD;
  compressing, by the SSD, the to-be-written data to obtain compressed data;
  storing, by the SSD, the compressed data;
  converting, by the SSD, the allocated blank logical block into a valid logical block, wherein the valid logical block is a logical block whose logical address is occupied by valid data; and
  sending, by the SSD, first feedback information to the controller, wherein the first feedback information indicates a remaining logical capacity of the SSD after the compressed data is stored, wherein the remaining logical capacity of the SSD corresponds to an actual amount of free data blocks on the SSD available for storing data;
  querying, by the SSD, a quantity of remaining blank logical blocks in the SSD; and,
  sending, by the SSD, second feedback information to the controller, wherein the second feedback information indicates a quantity of remaining blank logical blocks and/or remaining capacity of the SSD, wherein the remaining capacity is based on the quantity of the remaining blank logical blocks;
  receiving, by the SSD, a command from the controller, wherein the command comprises a logical address range, and the command instructs to mark valid data in the logical address range as invalid data;
  converting, by the SSD, a valid logical block in the logical address range into an isolated logical block, wherein the isolated logical block is a logical block whose logical address is not to be used;
  determining, by the SSD, a size of physical space occupied by data in the logical address range;
  selecting, by the SSD, partial over-provisioning space from over-provisioning space, wherein a size of the partial over-provisioning space is equal to the size of the physical space occupied by the data in the logical address range; and
  using, by the SSD, the partial over-provisioning space as a free physical space of the SSD.

3. A solid state disk, comprising:
  a communications interface, configured to communicate with a controller;
  a storage medium, configured to provide storage space; and
  a processor, connected to the communications interface and the storage medium, and configured to:
  receive a write request from the controller through the communications interface, wherein the write request carries to-be-written data;
  allocate a blank logical block to the to-be-written data, wherein the blank logical block is a logical block with a free logical address, the logical block corresponding to a segment of logical capacity of the storage medium;
  compress the to-be-written data to obtain the compressed data;
  determine, according to a size of the to-be-written data and a size of the compressed data, a quantity of blank logical blocks that need to be added in the solid state disk,
  wherein a quantity M of blank logical blocks that need to be added in the solid state disk is equal to a rounded-down result of dividing D by L, wherein D indicates a difference between a length of the to-be-written data and a length of the compressed data, and L indicates a length of a logical block in the solid state disk;
  store the compressed data in the storage medium;
  send first feedback information to the controller, wherein the first feedback information indicates a remaining logical capacity of the storage medium after the compressed data is stored, wherein the remaining logical capacity of the SSD corresponds to an actual amount of free data blocks on the SSD available for storing data;
  convert the allocated blank logical block into a valid logical block, wherein the valid logical block is a logical block whose logical address is occupied by valid data;
  query a quantity of remaining blank logical blocks in the solid state disk; and
  send second feedback information to the controller, wherein the second feedback information indicates a quantity of remaining blank logical blocks and/or remaining capacity on the SSD, wherein the remaining capacity is based on the quantity of the remaining blank logical blocks.

4. A solid state disk, comprising:
  a communications interface, configured to communicate with a controller;
  a storage medium, configured to provide storage space; and
  a processor, connected to the communications interface and the storage medium, and configured to:
  receive a write request from the controller through the communications interface, wherein the write request carries to-be-written data;
  allocate a blank logical block to the to-be-written data, wherein the blank logical block is a logical block with a free logical address, the logical block corresponding to a segment of logical capacity of the storage medium;
  compress the to-be-written data to obtain compressed data;
  store the compressed data in the storage medium; and
  send first feedback information to the controller, wherein the first feedback information indicates a remaining logical capacity of the storage medium after the compressed data is stored, wherein the remaining logical capacity of the SSD corresponds to an actual amount of free data blocks on the SSD available for storing data;
  convert the allocated blank logical block into a valid logical block, wherein the valid logical block is a logical block whose logical address is occupied by valid data;
  query a quantity of remaining blank logical blocks in the solid state disk;
  send second feedback information to the controller, wherein the second feedback information indicates a quantity of remaining blank logical blocks and/or remaining capacity on the SSD, wherein the remaining capacity is based on the quantity of the remaining blank logical blocks;
  receive a command from the controller through the communications interface, wherein the command comprises a logical address range, and the command instructs to mark valid data in the logical address range as invalid data;

convert a valid logical block in the logical address range into an isolated logical block, wherein the isolated logical block is a logical block whose logical address cannot be used;

determine a size of physical space occupied by data in the logical address range;

select partial over-provisioning space from over-provisioning space, wherein a size of the partial over-provisioning space is equal to the size of the physical space occupied by the data in the logical address range; and use the partial over-provisioning space as a free physical space of the storage medium.

5. A storage system, comprising a controller and a solid state disk, wherein the solid state disk, comprising:

a communications interface, configured to communicate with a controller;

a storage medium, configured to provide storage space; and a processor, connected to the communications interface and the storage medium, and configured to:

receive a write request from the controller through the communications interface, wherein the write request carries to-be-written data;

compress the to-be-written data to obtain compressed data; store the compressed data in the storage medium; and send first feedback information to the controller through the communications interface, wherein the first feedback information indicates a remaining capacity of the storage medium after the compressed data is stored; and, wherein the controller is configured to:

generate a write request comprising the to-be-written data; receive a response message for the write request from the processor through the communications interface, wherein the response message comprises a logical address of the to-be-written data in the storage medium; and record a mapping relationship between a logical address of the to-be-written data in a disk array and the logical address of the to-be-written data in the storage medium.

6. The storage system according to claim 5, wherein the controller is further configured to: receive new to-be-written data from a host; determine a remaining capacity of the solid state disk according to the first feedback information; and when the remaining capacity of the solid state disk is greater than a size of the new to-be-written data, write the new to-be-written data into the solid state disk.

* * * * *